US008772181B2

United States Patent
Noda et al.

(10) Patent No.: US 8,772,181 B2
(45) Date of Patent: Jul. 8, 2014

(54) METHOD FOR PRODUCING GRAPHENE, GRAPHENE PRODUCED ON SUBSTRATE, AND GRAPHENE ON SUBSTRATE

(75) Inventors: Suguru Noda, Tokyo (JP); Soichiro Takano, Tokyo (JP)

(73) Assignee: Japan Science and Technology Agency, Saitama (JP)

( * ) Notice: Subject to any disclaimer, the term of this patent is extended or adjusted under 35 U.S.C. 154(b) by 0 days.

(21) Appl. No.: 14/001,171

(22) PCT Filed: Feb. 27, 2012

(86) PCT No.: PCT/JP2012/054810
§ 371 (c)(1),
(2), (4) Date: Sep. 12, 2013

(87) PCT Pub. No.: WO2012/118023
PCT Pub. Date: Sep. 7, 2012

(65) Prior Publication Data
US 2013/0341792 A1      Dec. 26, 2013

(30) Foreign Application Priority Data
Feb. 28, 2011   (JP) .................................. 2011-042781

(51) Int. Cl.
H01L 21/469   (2006.01)
H01L 29/08   (2006.01)

(52) U.S. Cl.
USPC ............................................ 438/781; 257/40

(58) Field of Classification Search
USPC .............. 438/82, 99, 623, 781; 423/447, 460; 257/40, 642
See application file for complete search history.

(56) References Cited

U.S. PATENT DOCUMENTS

| 8,641,915 B2 * | 2/2014 | Kim et al. ........................ 216/37 |
| 2010/0218801 A1 * | 9/2010 | Sung et al. ..................... 136/244 |
| 2011/0243830 A1 * | 10/2011 | Ozaki et al. ............... 423/445 R |

FOREIGN PATENT DOCUMENTS

| JP | 2009-143799 A | 7/2009 |
| JP | 2010-089996 A | 4/2010 |
| WO | 2010/001686 A1 | 1/2010 |
| WO | 2010/043716 A1 | 4/2010 |

OTHER PUBLICATIONS

Kenkyu Yo et at, "Kinzoku Yuki Kesshoka ni yoru Tanso Usumaku kara no Graphene Sakusei", The Society of Chemical Engineers, Japan Kanto Shibu Taikai Kenkyu Happyo Koen Yoshisyu, vol. 2010, Jul. 19, 2010, p. 79.

Keun Soo Kim et al., Large-scale pattern growth of graphene films for stretchable transparent electrodes, Nature, vol. 457, pp. 706-710, Macmillan Publishers Limited., Feb. 5, 2009.

* cited by examiner

*Primary Examiner* — Calvin Lee
(74) *Attorney, Agent, or Firm* — Enshan Hong VLP Law Group LLP

(57) ABSTRACT

A production method for producing graphene on a substrate, and the like are provided. According to the method, in a forming step heating is conducted to a solid solution temperature at which a solid solution of carbon dissolved in a metal is able to be formed, and a solid solution layer (505) composed of the solid solution on a substrate (103) is formed; and in a removing step graphene (102) is grown on the substrate (103) by removing the metal from the solid solution layer (505) while maintaining the heating to the solid solution temperature. As a solvent for dissolving carbon a metal composed of a single element as well as various alloys are applicable. The graphene (102) touches directly the substrate (103), by removing the metal from the solid solution layer (505) by supplying an etching gas.

14 Claims, 34 Drawing Sheets

METHOD FOR PRODUCING GRAPHENE, GRAPHENE PRODUCED ON SUBSTRATE, AND GRAPHENE ON SUBSTRATE

PRIORITY CLAIM

This is a U.S. national stage of application No. PCT/JP2012/054810, filed on Feb. 27, 2012. Priority is claimed on the following application: Country: Japan, Application No.: 2011-042781, Filed: Feb. 28, 2011, the content of which is incorporated here by reference.

BACKGROUND OF THE INVENTION

1. Field of the Invention

The present invention relates to a production method for graphene, graphene produced on a substrate, and graphene on a substrate.

2. Description of the Related Art

Graphene is carbon atoms hexagonally-arranged through $sp^2$ bonds forming a monolayer sheet-like crystal, or a plurality of the sheets piled up, which is superior in electrical characteristic, and mechanical strength, and is expected to be applied to various devices.

CITATION LIST

For example, a study is in progress for applying the electrical conductivity of graphene to an electronic element, a semiconductor element, an electronic circuit, an electrical circuit, an integrated circuit, and the like.

Patent Literature

Namely, such applications of graphene are conceivable as an application to a transparent electrode for a liquid crystal display, a touch screen, a solar cell, and the like, an application to wiring, an electrode, and a terminal for a semiconductor integrated circuit or a flexible integrated circuit, and an application to a transfer channel for an electron or a positive hole between a source and a drain of a field effect transistor.

For this purpose, it is required to grow graphene on various substrates (a silicon dioxide substrate, a silicon substrate provided with a silicon dioxide layer on the surface, as well as those having a multilayer structure composed of an insulator, a semiconductor, and a conductor). Accordingly, various production techniques for graphene on a substrate have been proposed.

For example, Non Patent Literature 1 has proposed a technique, by which a nickel thin-film is formed on a substrate as a catalyst, carbon is dissolved in the nickel thin-film by a thermal chemical vapor deposition (CVD) method, then graphene is precipitated on the nickel thin-film by quenching, thereafter the nickel thin-film is etched and the graphene is transcribed to another substrate to form patterned graphene on the substrate as a transparent electrode.

CITATION LIST

Non Patent Literature

Non Patent Literature 1: Keun Soo Kim, et al., "Large-scale pattern growth of graphene films for stretchable transparent electrodes", Nature, vol. 457, pp. 706-710, MacMillan Publishers Limited., May 2, 2009

SUMMARY OF INVENTION

However, once graphene is formed, a catalyst metal is sandwiched between the graphene and a substrate, removal of the metal become very cumbersome and it is possible that complete removal become often difficult.

Further, since a defect is generated when graphene is transcribed, a fine pattern is able to be hardly formed.

Therefore, a technique for producing graphene attached directly to a substrate surface without remaining a catalyst metal on the substrate surface has been strongly sought-after.

Further, in graphene produced according to a conventional art, crystals grow randomly from a catalyst metal so that graphene forms an inhomogeneous polycrystalline film with randomly formed crystal grain boundaries.

Therefore, a technique for limiting a zone where crystal grain boundaries are formed to an intended zone by regulating the growth of graphene, and producing a largest possible single crystal graphene has been sought-after.

For finding solutions therefor, an object of the present invention is to provide a production method for graphene, graphene produced on a substrate, and graphene on a substrate.

A production method for graphene with respect to the first aspect of the present invention is constituted with a forming step for conducting heating to a solid solution temperature at which a solid solution of carbon dissolved in a metal is able to be formed, and forming a solid solution layer comprising the solid solution on the substrate; and a removing step for removing the metal from the solid solution layer while maintaining the heating to the solid solution temperature.

A solid solution means herein a mixture of a plurality of substances dissolving each other forming as a whole a homogeneous solid. In general a main component of a solid solution is called as a solvent of the solid solution, and other substances are called as solutes of the solid solution.

According to the present invention, a solid solution is formed with a metal as a solvent and carbon as a solute, but such formation of a solid solution is possible only within a certain temperature range. The temperature range is called as a solid solution temperature. For a solid solution temperature, the lower limit or the upper limit thereof is determined by a combination of materials or a composition of solvents.

By removing a metal while maintaining the heating of a solid solution, carbon that is not able to remain dissolved any more in the solid solution precipitates keeping its high mobility to grow graphene on a substrate. On this occasion, high mobility carbon moves to graphene first nucleated by removal of a metal, and becomes incorporated to increase the crystal grain size of the graphene, while suppressing new nucleation of the graphene.

As a metal to be used as a solvent for a solid solution according to the present invention, it is possible that a pure metal composed of a single metal element, an alloy composed of a plurality of metal elements, and also an alloy composed of a metal element and a nonmetallic element be applied. Namely, it is possible that a solvent, which dissolves carbon as a solute for a solid solution and contains a metal as its main component, be applied as a solvent for a solid solution.

Further, it is possible that a production method according to the present invention be so constituted that, in the forming step, a reducing agent that is able to reduce an oxide of the metal is supplied, and in the removing step, the metal contained in the solid solution layer is removed by supplying an etching gas. If etching is carried out long enough to remove all of metals contained in a solid solution layer according to the production method, graphene comes to touch directly a substrate without intercalating a metal. Due to various causes it is possible that a metal oxide be generated in a solid solution layer, but according to the present production method, a supplied reducing agent prevents the metal oxide from remaining on a substrate, and good quality graphene is able to be obtained.

Further, it is possible that a production method according to the present invention be so constituted, that, in the forming step, an initial layer comprising carbon is formed on the substrate, a metallic layer comprising the metal is formed on the formed initial layer, and the formed initial layer and the formed metallic layer are heated to the solid solution temperature to form the solid solution layer. Namely, in this production method, an initial layer is composed of carbon alone, or a material containing carbon (for example, mixture of carbon and a metal), and a metallic layer is composed of a metal alone, or a material containing a metal (for example, an alloy of metals, or an alloy of a metal and a nonmetal). First the initial layer is formed, and then the metallic layer is formed.

Further, it is possible that a production method according to the present invention be so constituted, that, in the forming step a metallic layer comprising the metal is formed on the substrate, an initial layer comprising carbon is formed on the formed metallic layer, and the formed initial layer and the formed metallic layer are heated to the solid solution temperature to form the solid solution layer. Namely, in this production method, as in the above mode, an initial layer is composed of carbon alone, or a material containing carbon (for example, mixture of carbon and a metal), and a metallic layer is composed of a metal alone, or a material containing a metal (for example, an alloy of metals, or an alloy of a metal and a nonmetal). However, in the current production method, a metallic layer is first formed and then the initial layer is formed.

Further, it is possible that a production method according to the present invention be so constituted, that, in the forming step an initial layer comprising a mixture of the metal and carbon is formed on the substrate, and the formed initial layer is heated to the solid solution temperature to form the solid solution layer. Namely, in this production method, different from the above modes, a mixture of carbon and a metal is used as an initial layer. Namely, a mixture of carbon and a metal is heated to form a solid solution layer, in which carbon is dissolved in a metal. In the current production method formation of an independent metallic layer is not necessary.

Further, it is possible that a production method according to the present invention be so constituted, that, in the forming step the initial layer is formed into a predetermined pattern, so as to form the graphene in the predetermined pattern.

Further, it is possible that a production method according to the present invention be so constituted, that, in the forming step the initial layer is formed to cover all or a part of a surface of the substrate, so as to form the graphene into a uniform continuous film covering all or a part of the surface of the substrate.

Further, it is possible that a production method according to the present invention be so constituted, that a concentration distribution in a direction parallel to a surface of the substrate among concentration distributions of the carbon in the solid solution layer is made inhomogeneous, so as to grow the graphene in the direction parallel to the surface of the substrate. In this regard, it is possible that the concentration distribution in a direction not parallel to the surface of the substrate be uniform or inhomogeneous.

Further, it is possible that a production method according to the present invention be so constituted, that the thickness of at least one of the formed initial layer and the formed metallic layer is made inhomogeneous, so as to make a concentration distribution in a direction parallel to a surface of the substrate among concentration distributions of the carbon in the solid solution layer inhomogeneous, and to grow the graphene in the direction parallel to the surface of the substrate. According to the present invention, a solid solution layer is formed from an initial layer and a metallic layer, because carbon in the initial layer is dissolved by heating in a metal in the metallic layer. In this case, it is desirable to adjust a heating condition, so that, in forming a solid solution layer, carbon is able to move over a submicrometer distance to mix with a substrate in a vertical direction, but is not able to move a few μm or more to mix in a direction parallel to a substrate. With such an adjustment, and, for example, in the event that the thickness of an initial layer is made uniform and the thickness of a metallic layer is made nonunifrom, the carbon concentration of a solid solution layer at an area, where the metallic layer has been thick, becomes low, and at an area, where the metallic layer has been thin, the carbon concentration of a solid solution layer becomes high. Furthermore, in the event that the thickness of an initial layer is made nonunifrom and the thickness of a metallic layer is made uniform, the carbon concentration of a solid solution layer at an area, where the metallic layer has been thick, becomes high, and at an area, where the metallic layer has been thin, the carbon concentration of a solid solution layer becomes low. When a metal is removed, graphene grows from a zone where the carbon concentration is high toward a zone where the carbon concentration is low. In this regard, it is possible that the concentration distribution in a direction not parallel to a surface of the substrate be either uniform or inhomogeneous.

Further, it is possible that a production method according to the present invention be so constituted, that the thickness of the formed metallic layer is provided with a gradient, so as to grow the graphene in the direction of a component parallel to the surface of the substrate among directions of the gradient. The current invention is a favorable embodiment of the above inventions for attaining reduction of the production cost or the like, by means of a construction technique by which a gradient is provided in the thickness of the metallic layer.

Further, it is possible that a production method according to the present invention be so constituted, that the metallic layer comprises a first region extending parallel over a surface of the substrate and a second region extending parallel over a surface of the substrate, the two regions being connected by a constriction, the first region having smaller thickness of the metallic layer than the second region, and the second region being provided with a gradient in the thickness of the metallic layer, which increases with the distance from the constriction.

Further, it is possible that a production method according to the present invention be so constituted, that a concentration distribution of the supplied etching gas in a direction parallel to a surface of the substrate is made inhomogeneous, so as to grow the graphene in the direction parallel to the surface of the substrate. In this regard, it is possible that the concentration distribution in a direction not parallel to a surface of the substrate be either uniform or inhomogeneous.

Further, it is possible that a production method according to the present invention be so constituted, that the substrate is composed of a monolayer or multilayers.

Further, it is possible that a production method according to the present invention be so constituted, that the substrate is a silicon dioxide substrate or a silicon substrate provided with a silicon dioxide layer on a surface, the metal is iron, nickel, cobalt, or an alloy comprising the same, and the etching gas is chlorine.

A production method for graphene with respect to the second aspect of the present invention is so constituted that line-shaped graphene grown in a first direction parallel to a surface of a substrate and directly attached to the surface is produced by the above production method, and planar graphene grown from the line-shaped graphene in a second direction parallel to the surface and directly attached to the surface is produced by the above production method.

Graphene with respect to the third aspect of the present invention is so constituted that the same is produced on a substrate by the above production method.

Graphene on a substrate with respect to the fourth aspect of the present invention is so constituted that the graphene on a substrate is directly attached to a surface of the substrate, the crystal grain size of the graphene on a substrate in a first direction parallel to the surface is the largest among crystal grain sizes of the graphene on a substrate in any other directions parallel to the surface, and the crystal grain size of the graphene on a substrate in the first direction is larger than the crystal grain size of the graphene in a direction perpendicular to the surface.

Graphene on a substrate with respect to the fifth aspect of the present invention is so constituted that the graphene on a substrate is directly attached to a surface of the substrate, the graphene on a substrate has a plurality of crystal grain boundaries in a first direction parallel to the surface, the graphene on a substrate has a plurality of crystal grain boundaries in a second direction parallel to the surface, and the graphene on a substrate constitutes a single crystal inside each region surrounded by the crystal grain boundaries.

Further, it is possible that the graphene on a substrate according to the present invention be so constituted that the first direction is orthogonal to the second direction, the intervals of crystal grain boundaries along the first direction are constant, and the intervals of crystal grain boundaries along the second direction are constant Further, with respect to graphene on a substrate according to the present invention, it is possible that the substrate be constituted with a monolayer or multilayers.

Further, it is possible that graphene on a substrate according to the present invention be so constituted that the thickness of the graphene on a substrate is 300 nanometers or less and the crystal grain size of the graphene on a substrate in the first direction is 30 µm or more.

Further, it is possible that graphene on a substrate according to the present invention be so constituted that the graphene on a substrate has a predetermined pattern and the line width of the pattern is 10 µm or less.

Further, with respect to graphene on a substrate according to the present invention, it is possible that the predetermined pattern be so constituted to form wiring, an electrode, or a terminal for a current path or voltage application, or a channel for transferring an electron or a positive hole.

Moreover, a graphene device provided with the graphene on a substrate and the substrate attached directly with the graphene on a substrate is able to be constituted.

According to the present invention, a production method for graphene, graphene produced on a substrate, and graphene on a substrate is able to be provided.

DETAILED DESCRIPTION OF THE PRESENTLY PREFERRED EMBODIMENTS

Embodiments of the present invention will be described below. In this regard, the embodiments described below are only for explanatory purpose and not for limiting the scope of the present inventions. Consequently, those skilled in the art are able to adopt an embodiment in which any of the elements or all of the elements have been replaced with equivalent elements, and such an embodiment is considered to be falling within the scope of the present invention.

In the figures herein dimensions and shapes are appropriately expressed exaggeratedly to facilitate understanding.

Example 1

Figure 1A:
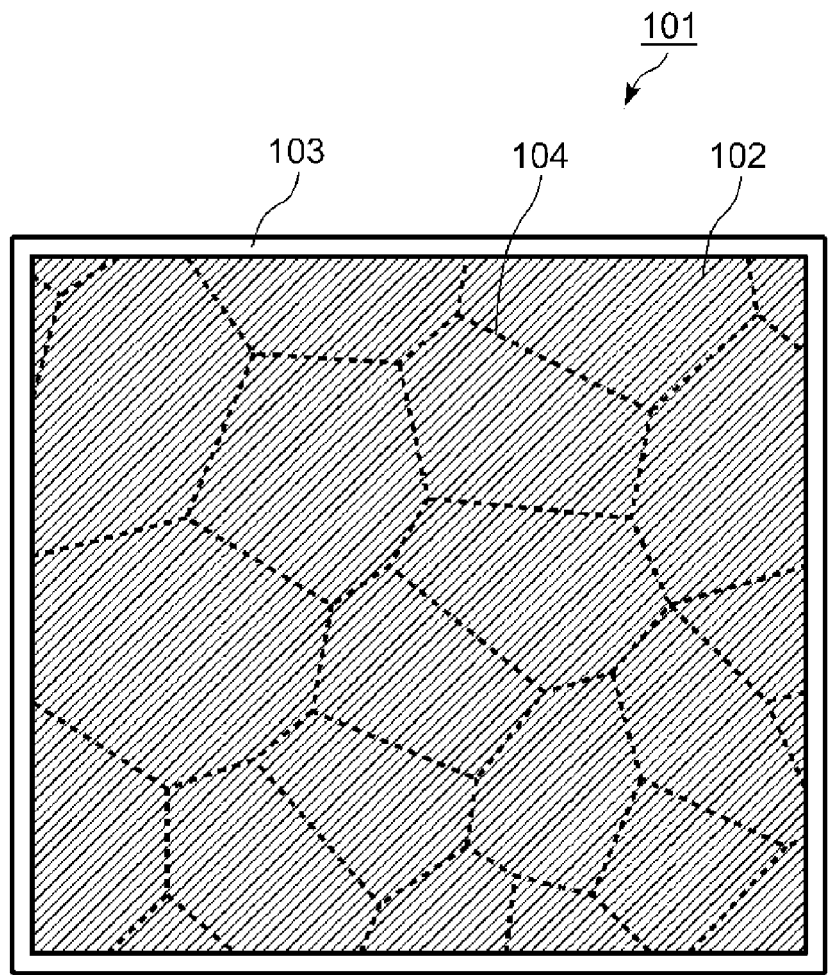
FIG. 1A is a plan view showing the first example of graphene on a substrate according to the present embodiment.
Figure 1B:
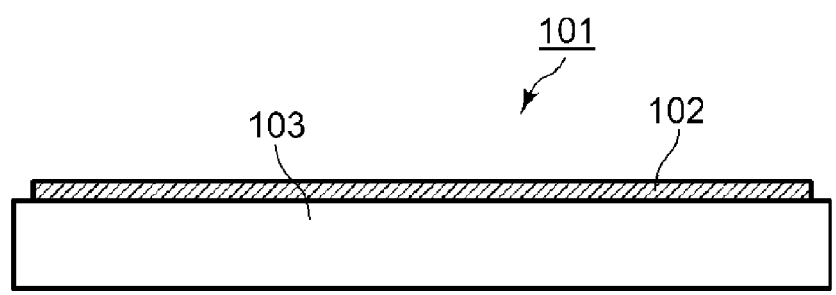
FIG. 1B is a cross-sectional view showing the first example of graphene on a substrate according to the present embodiment.

FIG. 1A is a plan view showing the first example of graphene on a substrate according to the present embodiment, and FIG. 1B is a cross-sectional view showing the first example of graphene on a substrate according to the present embodiment. The example will be described below referring to the above figures.

As shown in the figures, the graphene 102 forms a layer directly attached to a surface of the substrate 103. The thickness of graphene 102 producible according to a conventional technique was maximum approx. 30 nanometers, but the thickness of graphene 102 according to the present embodiment is able to be selected at a desired thickness not beyond 300 nanometers.

It is possible that the substrate 103 be a silicon dioxide substrate or a silicon substrate provided with a silicon dioxide layer on a surface, or moreover have a multilayer structure. In the case of a multilayer structure, it is possible that each layer be, for example, appropriately provided with a conductor, a semiconductor, or an insulator to form a semiconductor circuit, an electronic circuit, or an electrical circuit.

By attaching the graphene 102 directly to a surface of the substrate 103, a graphene device 101 (graphene element) is formed as a whole. In this regard, an "element" means herein a component that preforms a function, and a "device" means a component constituted with one or plural elements, respectively.

The graphene 102 of the first example forms a single crystal in a range surrounded by crystal grain boundaries 104 (in the current figure, depicted as thick dotted lines). The regions surrounded by crystal grain boundaries 104 have different shapes each other, this is because the graphene 102 has grown randomly on a surface of the substrate 103. Approximately, the center of each region corresponds to the initiation point for precipitation of the graphene 102.

Although the graphene 102 is indicated by hatching in the figures, the hatching does not mean a crystal forming direction of the graphene 102. As described above, crystal grain boundaries 104 are generated in the graphene 102 in a direction along the surface of the substrate 103, however in the vertical direction to the surface of the substrate 103 the crystal structures of the graphene 102 are uniform at almost all places.

Although the crystal grain boundaries 104 extend from a surface of the graphene 102 to a surface of the substrate 103, depiction thereof is omitted appropriately to facilitate understanding in FIG. 1B and the following figures.

Figure 2:
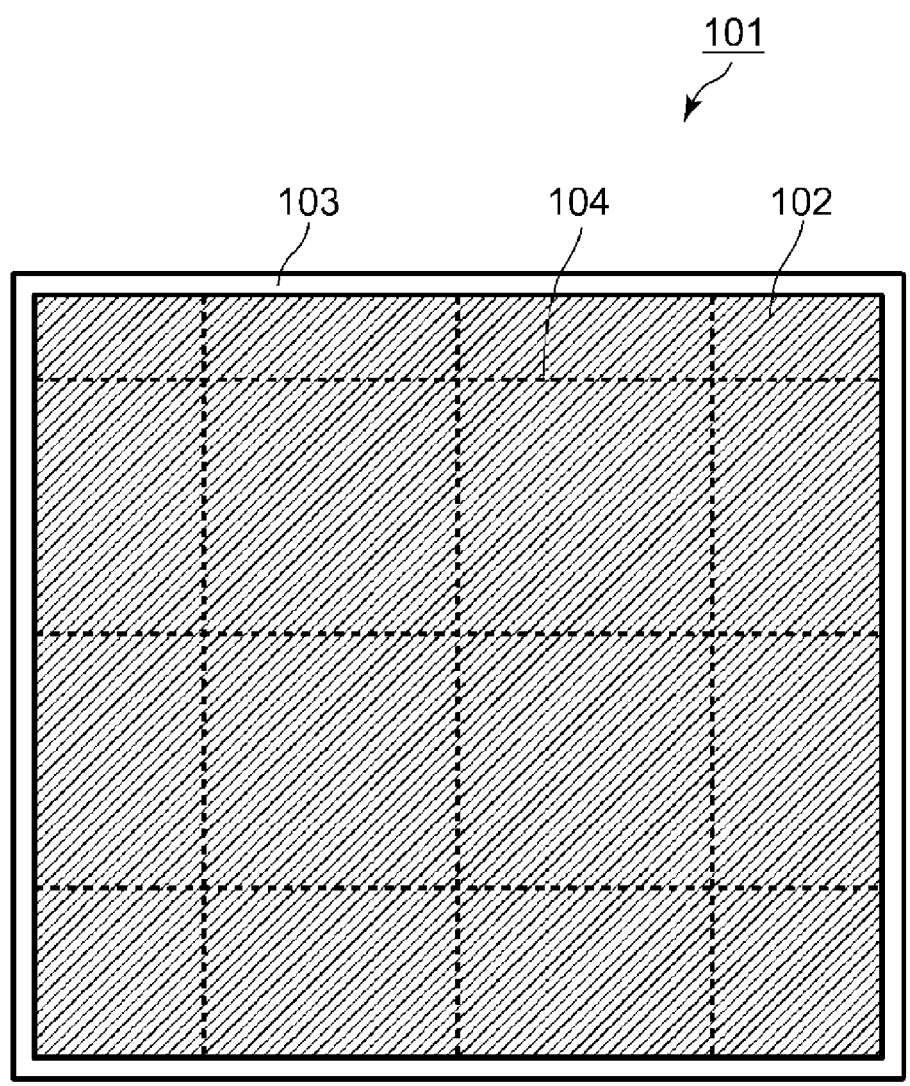
FIG. 2 is a plan view showing the second example of graphene on a substrate according to the present embodiment.

FIG. 2 is a plan view showing the second example of graphene on a substrate according to the present embodiment. The example will be described below referring to the figure.

In the graphene device 101 shown in the figure, crystal grain boundaries 104 of the graphene 102 is formed to a regular grid at constant intervals in a vertical method (a first direction) and a horizontal method (a second direction). Namely, the graphene 102 composed of square single crystals covers the substrate 103.

Since, as described below, an initiation point or a direction of growth of the graphene 102 on the substrate 103 is able to be regulated according to the present invention, the crystal grain boundaries 104 are able to be formed to various shapes, such as square and rectangle. Further, the area of a single crystal of the graphene 102 is able to be made by far larger than that in the past. Specifically, the crystal grain size of a single crystal of the graphene 102 is able to be made 30 μm or more.

The first direction and the second direction of extension of the crystal grain boundaries 104 cross typically at a right angle as described above, however if they cross obliquely at a constant angle, the shape of a single crystal of the graphene 102 becomes parallelogram. Further, the intervals between the crystal grain boundaries 104 are not required to be constant By applying a production method according to the present invention, growth of graphene 102 is able to be made more stable than in the past.

The crystal grain size of the graphene 102 is maximal in a growing direction of the graphene 102 in producing the graphene device 101.

As described above, in the graphene device 101 according to the present embodiment, the surface of the substrate 103 is covered by large single crystals of graphene 102, and one of characteristics of the same is that the crystal grain boundaries 104 of the graphene 102 are few and located at predetermined places and the crystal grain sizes are large.

If the size of a substrate 103 is made small, and the environment for producing the graphene device 101 is set appropriately, and the growth of graphene 102 is carried out over a long time period, it is not impossible for a single crystal of the graphene 102 to cover the entire surface of the substrate 103.

Such graphene device 101, in which graphene 102 covers the entire surface of the substrate 103, is able to be applied, in view of the electrical conductivity and the mechanical strength of graphene 102, as described below, as a pattern; or used as a substrate product to be fabricated to a various devices, such as a semiconductor integrated circuit, and a MEMS; a transparent electrode for a solar cell, a surface-emitting light, a flat panel display, and a touch screen; and the like.

Figure 3:
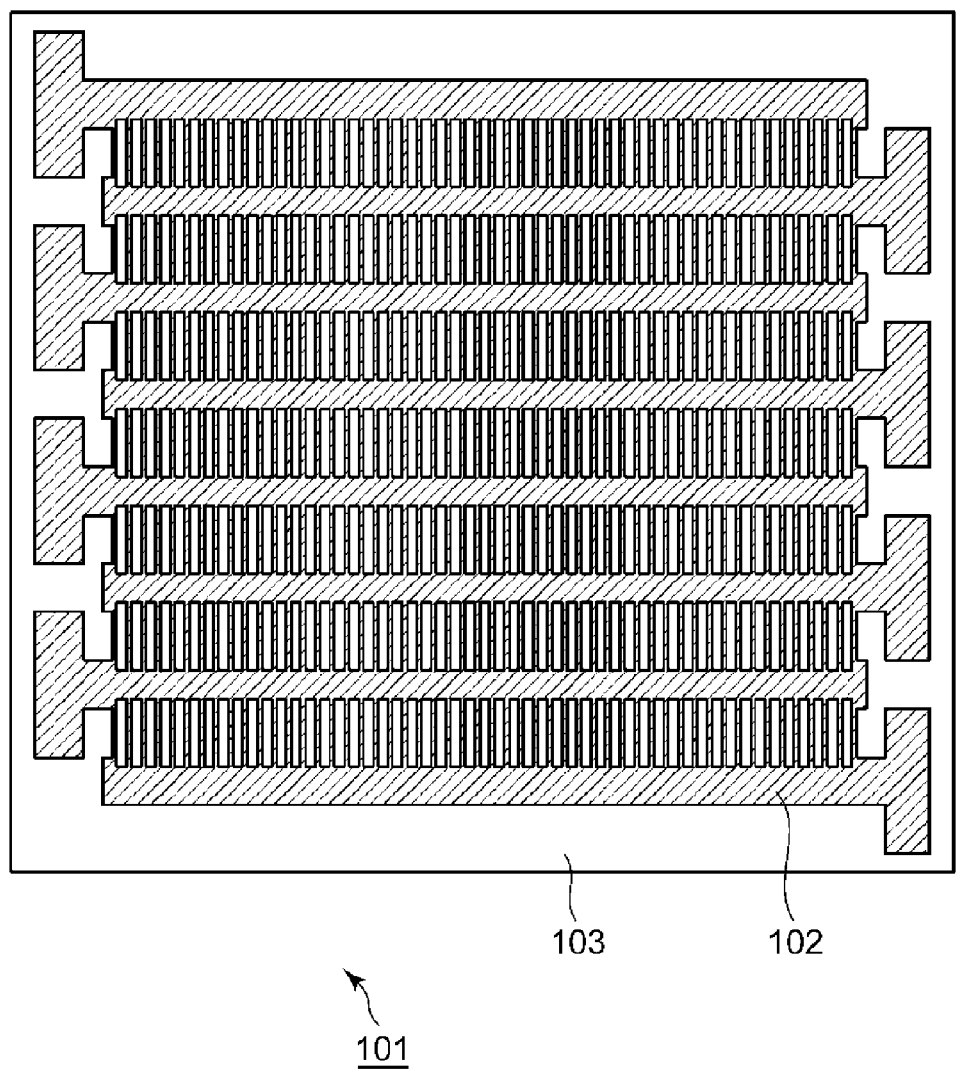
FIG. 3 is a plan view showing the third example of graphene on a substrate according to the present embodiment.

FIG. 3 is a plan view showing the third example of graphene on a substrate according to the present embodiment. The example will be described below referring to the figure.

In the graphene device 101 shown in the figure, the graphene 102 does not cover the entire surface of the substrate 103, but forms a pattern. Since graphene 102 is electrically conductive, the pattern is able to be applied to various wiring, terminals, electrodes, and the like. The pattern shape is not limited to that shown in the figure, and it is possible that the pattern shape be selected discretionarily.

By a conventional technique, in which a pattern of graphene is produced in advance and then transcribed, in producing a detailed pattern of micrometer scale, damages will occur during transcription. Meanwhile, as described below by a production method according to the present application, a pattern with the line width of 10 μm or less is able to be formed on a substrate. Further, by a conventional technique, in which graphene is once transcribed to a broad region of a substrate and then etched for patterning, the substrate is damaged in etching the graphene, which is especially problematic for application to a multilayer substrate. Meanwhile, by a production method according to the present application as described below, a simplified production process without etching of graphene is adopted, and therefore there occurs no such a problem.

Therefore the pattern is able to substitute for not only fine wiring by copper or aluminum but also a transparent electrode by indium tin oxide (ITO).

For example, in the case of a liquid crystal display, an application, in which glass is used as a substrate 103 and a transparent electrode composed of graphene 102 is formed directly on a surface of the glass in a pattern shape, is possible.

Further, the substrate 103 is not limited to a monolayer, and a multilayer structure provided with wiring or an object of conduction in each layer is possible.

Namely, it is possible that a substrate 103 be formed as a multilayer structure composed of semiconductors, wiring, insulation films in a semiconductor integrated circuit, and it is possible that graphene 102 be utilized as fine wiring connecting the respective elements in the multilayer structure.

Additionally, if wiring or an object of conduction is placed on the back side of a substrate 103, wiring penetrating the substrate 103 is to be provided and the wiring is able to be connected by graphene 102.

Further, graphene 102 is able to be utilized as a transfer path for an electron or a positive hole, such as channel between a source and a drain of a field effect transistor.

Figure 4:
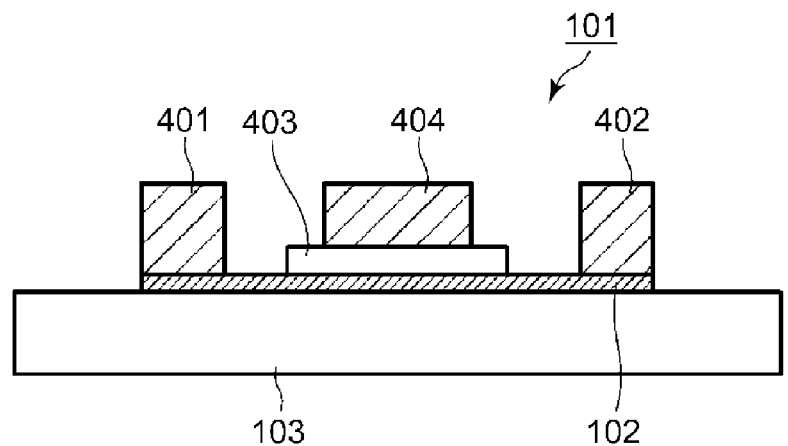
FIG. 4 is a diagram depicting a cross-section of a field effect transistor utilizing graphene on a substrate according to the present embodiment.

FIG. 4 is a diagram depicting a cross-section of a field effect transistor utilizing graphene on a substrate according to the present embodiment. The example will be described below referring to the figure.

As shown in the figure, the graphene 102 on the substrate 103 constitutes a transfer channel for an electron or a positive hole from a source electrode 401 to a drain electrode 402. A gate electrode 404 is placed intercalating the graphene 102 and an insulator 403, and by regulating the voltage applied to the gate electrode 404 the flow rate of an electron or a positive hole moving through the graphene 102 is regulated. As above, the graphene device 101 of the present mode functions as a field effect transistor.

Example 2

According to a conventional production method, detached graphene 102 was transcribed on to a substrate 103, or graphene 102 was precipitated on to a metal catalyst on a substrate 103 and then the metal catalyst was etched.

On the other hand, according to the present invention, graphene 102 with a large crystal grain size as disclosed in Example 1 is able to be directly formed on a surface of a substrate 103. First, the principle of the present production method will be described.

In the present embodiment, firstly to form a solid solution layer dissolving carbon in a metal, such as iron, cobalt, and nickel, on a surface of a substrate 103, the same are heated to a solid solution temperature.

Continuing heating, the metal contained in the solid solution layer is removed by an etching gas such as chlorine.

As the result, carbon precipitates as graphene 102 on a surface of the solid solution layer. This is because carbon is not able to remain dissolved due to decrease of the metal.

If etching is continued longer, the precipitated graphene 102 grows further. Since etching is carried out while maintaining a solid solution temperature, carbon that has not yet precipitated has mobility in the metal. Therefore, carbon that is not able to remain dissolved due to etching of the metal precipitates to form a crystal structure with the already precipitated graphene.

Finally, all the metal is removed and the graphene 102 comes to touch directly a surface of the substrate 103.

In this way, different from a conventional thermal CVD method using a metal catalyst, graphene 102 is able to be formed directly on a substrate 103 in a condition not containing a metal. Further, by selecting the shape of a solid solution layer appropriately, a pattern of the graphene 102 finer than that by a conventional transcription technique of graphene produced by a thermal CVD method is able to be formed.

In this regard, in forming a solid solution layer by conducting heating with supplying a reducing agent, such as a mixture gas of hydrogen and argon, that is able to reduce a metallic oxide, the oxide is able to be prohibited from remaining on the substrate.

However, if an atmosphere not allowing oxidation of a metallic (for example, an atmosphere with adequately low partial pressure or concentration of an oxidizing agent) or vacuum is able to be maintained during formation of a solid solution layer, the supply of a reducing agent is not necessary.

A case, in which an etching gas with a constant concentration touches a surface of a solid solution layer and a metal is etched uniformly, will be considered.

In this case, if the concentration distribution of carbon in the solid solution layer is uniform, the initiation point of precipitation of graphene 102 on the surface of the solid solution layer becomes random.

On the other hand, if the concentration distribution of carbon in the solid solution layer is inhomogeneous, graphene 102 precipitates initially at a point with high carbon concentration and grows toward points with low carbon concentration.

Therefore, by setting appropriately the concentration distribution of carbon, the growth initiation position and the growing direction of a crystal of graphene 102 is able to be regulated.

Further, if the concentration distribution of an etching gas is able to be set inhomogeneous, a metal is removed faster at a position with high concentration of the etching gas. Therefore, even if the concentration distribution of carbon is uniform in the solid solution layer, graphene 102 precipitates initially at a position with high concentration of the etching gas and grows toward a position with low concentration of the etching gas.

Accordingly, also by setting appropriately the concentration distribution of an etching gas, the growth initiation position and the growing direction of a crystal of graphene 102 is able to be regulated.

Therefore, if the initiation point and the direction of the growth of graphene are regulated, crystal grain boundaries of graphene are formed only at the growth initiation point and growth termination points, where graphene connects each other, the crystal grain boundaries are able to be regulated to predetermined positions, and an extremely large crystal grain size is able to be realized by reducing the growth initiation points of graphene.

Further by combining appropriately the above setting of the concentration distribution of carbon in a solid solution layer and the concentration distribution of an etching gas, it is possible that the growth initiation position and the growing direction of a crystal of graphene 102 be regulated.

In the above description, iron is used as a metal and chlorine is used as an etching gas. However, any metal that is able to dissolve carbon and an etching gas for the metal is able to be also used. Namely, by heating the metal and carbon on a substrate 103 to a solid solution temperature to dissolve carbon into the metal and form a solid solution layer, then continuing the heating an etching gas for the metal is supplied to remove the metal from the solid solution layer and to have graphene 102 precipitate and grow, so that a graphene device 101 with graphene 102 directly attached to a surface of the substrate 103 is able to be also produced.

As a metal to be used as a solvent of a solid solution as described above, a pure metal composed of a single metal element and an alloy composed of a plurality of metal elements are able to be used. However, it is possible that an alloy composed of a metal element and a semi-metallic element, an alloy composed of a metal element and a nonmetallic element, or the like be used as a solvent of a solid solution, insofar as carbon is able to be dissolved as a solvent, and the alloy is able to be removed by etching or the like.

The crystal grain size (mean value thereof) of graphene 102 in the growing direction along the substrate 103 becomes larger than the crystal grain sizes (mean values thereof) in any other directions (for example, the direction perpendicular to the substrate 103, or a direction along the substrate 103 but crossing the growing direction).

While, with respect to a mode of "continuation of heating", the temperature for forming a solid solution layer and the temperature for etching is not necessarily be same. For example, once a solid solution layer is formed and metal removal by etching is initiated, it is possible that the temperature be lowered gradually and reach a temperature, at which a solid solution is not able to be formed any more, (or a temperature slightly higher than the above temperature), when etching is completed.

The production method will be described in detail below referring to FIG. 5A to FIG. 5O. The figures are cross-sectional views for illustrating a process for producing a graphene device 101. While, the parameters listed below are just an example to facilitate understanding, and an embodiment with parameters appropriately replaced falls within the scope of the present invention.

Figure 5A:
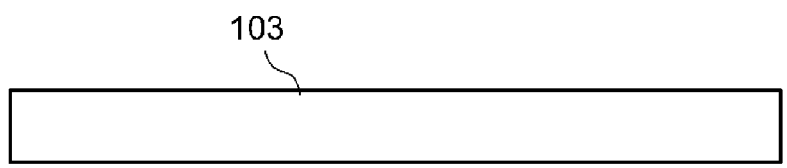
FIG. 5A is a cross-sectional view for illustrating a process for producing a graphene device.

As shown in FIG. 5A a substrate 103 is prepared as a basis for forming a prepared graphene device 101. Although a silicon dioxide substrate is used as the substrate 103 in the present example, as described above, a multilayer substrate, a substrate with various elements buried inside, a substrate to be provided with various elements on the rear surface, or the like is able to be also utilized.

Figure 5B:
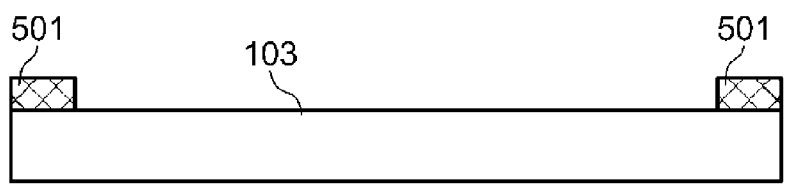
FIG. 5B is a cross-sectional view for illustrating a process for producing a graphene device.

As shown in FIG. 5B, a first mask 501 is formed on a surface of the substrate 103. The first mask 501 defines a pattern shape of graphene 102 to be formed finally.

When a photolithographic technique with visible light or ultraviolet light is applied, a resist is coated on the substrate 103 and the shape of the first mask is exposed on the resist surface, followed by developing and dissolving of the resist to form the first mask 501. Alternatively, it is possible that an electronic beam lithographic technique, or a technique, by which a mask made of a metal film provided with slits and holes is attached tightly, be applied.

The first mask 501 defines a pattern shape of graphene 102 in the finally produced graphene device 101. Namely, graphene 102 is formed in an exposed region of a surface of the substrate 103 not masked by the first mask 501.

Figure 5C:
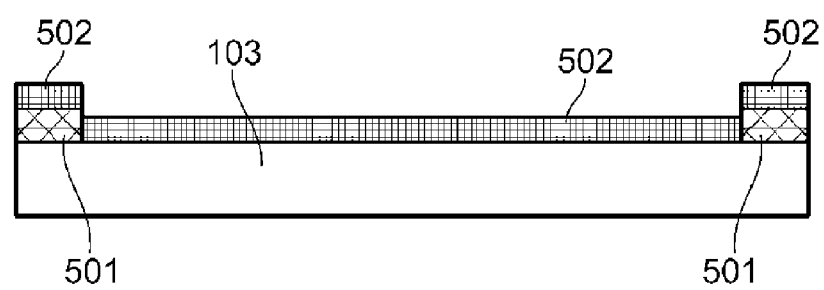
FIG. 5C is a cross-sectional view for illustrating a process for producing a graphene device.

Further, carbon is supplied by sputtering, vacuum deposition, CVD, or otherwise to form a carbon layer 502 as shown in FIG. 5C on a surface of the first mask 501 and through openings of the first mask 501 on an exposed surface of the substrate 103. It is possible that the carbon layer 502 be amorphous or crystalline.

Although in the figure carbon is supplied uniformly and the carbon layer 502 with uniform thickness is formed, it is possible that carbon be supplied only near the openings of the first mask 501 to suppress formation of unnecessary carbon layer 502.

Figure 5D:
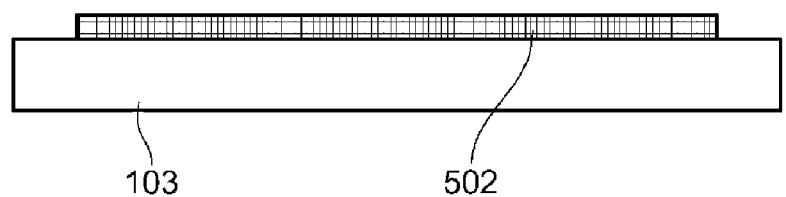
FIG. 5D is a cross-sectional view for illustrating a process for producing a graphene device.

Then by performing dissolution of the resist, the first mask 501 and the carbon layer 502 formed on the surface thereof are removed as shown in FIG. 5D to yield a carbon layer 502 having the same shape as the intended pattern as an initial layer (a layer having an initial shape to define a final pattern shape of graphene 102).

Namely, naming of an initial layer means not 'a first formed layer' but "a layer, in which carbon to be used as a source material for graphene 102 is first contained".

Figure 5E:
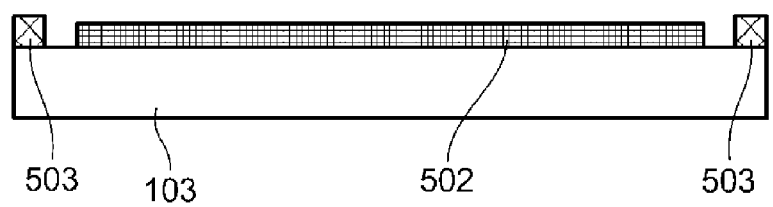
FIG. 5E is a cross-sectional view for illustrating a process for producing a graphene device.

Further, as shown in FIG. 5E, a second mask 503 is formed on the surface of the substrate 103 applying a similar technique as for the first mask 501. In the present example, an opening of the second mask 503 has a shape including the entire opening of the first mask 501, namely a shape same as or larger than the opening of the first mask 501. In this way, the carbon layer 502 is positioned in the opening of the second mask 503.

Figure 5F:
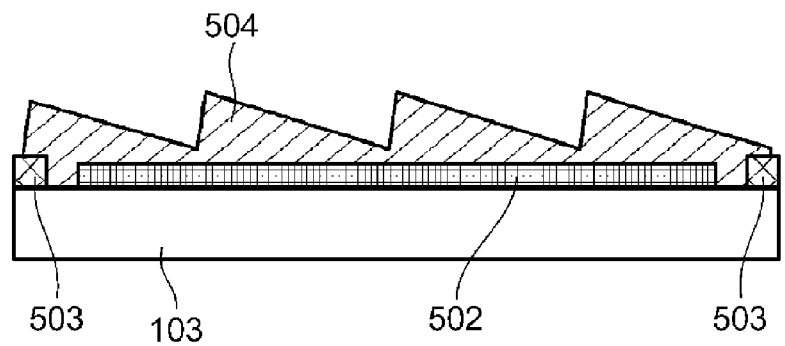
FIG. 5F is a cross-sectional view for illustrating a process for producing a graphene device.

Then, a metal is supplied by sputtering, vacuum deposition, CVD, or otherwise to form a metallic layer 504 as shown in FIG. 5F on a surface of the second mask 503 and through openings of the second mask 503 on exposed surfaces of the carbon layer 502 and the substrate 103.

In the figure, a metal is supplied not uniformly but nonuniformly, so that the thickness of the metallic layer 504 increases gradually and then returns to the original thickness cyclically forming a saw-toothed shape. By applying a mask vapor deposition method, the thickness of the metallic layer 504 is able to be changed as above.

In this regard, the mask vapor deposition method is specifically a technique as follows. Namely, by providing a metal foil or the like with a plurality of slits to form a self-supporting mask. Next, the self-supporting mask is placed with a certain distance from the substrate 103, and then a metal is supplied by sputtering through the self-supporting mask up to the substrate 103. In this case, in a zone facing a slit of the self-supporting mask a metallic layer 504 becomes thick, and with increased distance therefrom the metallic layer 504 becomes thinner.

Further, a plurality of wires placed touching the surface of the substrate 103 are able to substitute for the above self-supporting mask. In this case the wires constitute obstacles to sputtering and therefore the metallic layer 504 becomes thin in the vicinity of the wires, and with increased distance therefrom the metallic layer 504 becomes thick.

Further, there is a technique by which one or plural movable shutters are provided and the shutters are gradually shut, when a metal is supplied by sputtering. By the technique the metallic layer 504 near a part, where a shutter is first closed, becomes thin and the metallic layer 504 near a part, where a shutter is last closed, becomes thick.

In the present example, although the sputtering direction is oblique to the substrate 103, and the saw-tooth shape of the metallic layer 504 from the top to the foot is asymmetric, the same from the top to the foot are able to be made symmetric by setting the sputtering direction vertical to a surface of the substrate 103 as described below in Example 7.

Figure 5G:
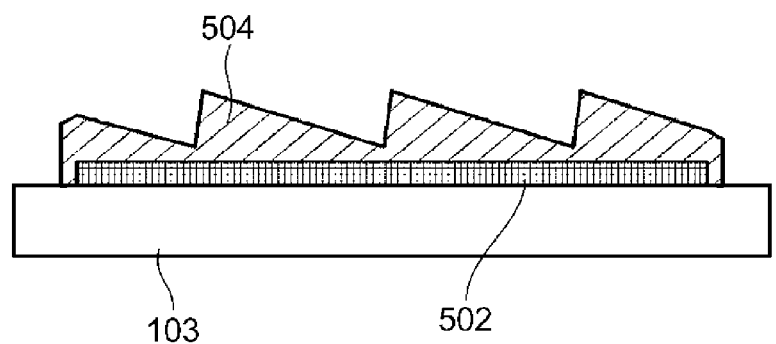
FIG. 5G is a cross-sectional view for illustrating a process for producing a graphene device.

Then by performing dissolution of the resist, the second mask 503 as well as the metallic layer 504 formed on the surface thereof are removed as shown in FIG. 5G. As the result, the carbon layer 502 is covered by the metallic layer 504 on the surface of the substrate 103.

Figure 5H:
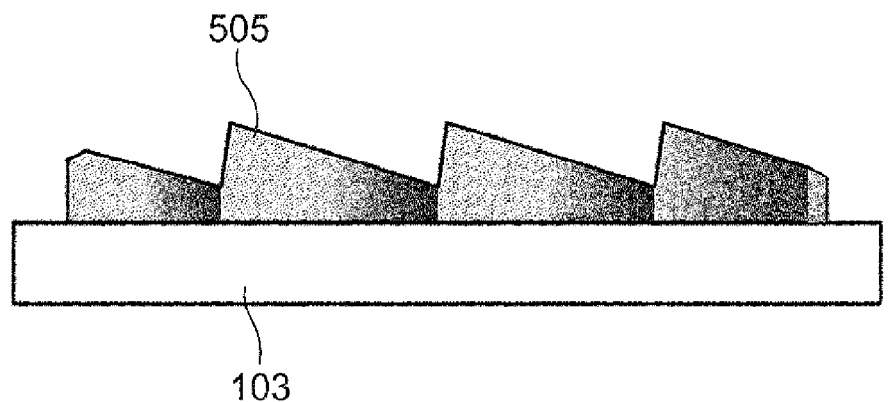
FIG. 5H is a cross-sectional view for illustrating a process for producing a graphene device.

Then, by heating to a solid solution temperature allowing carbon to dissolve in a metal, the carbon layer 502 dissolves in the metallic layer 504 to form a solid solution layer 505 as shown in FIG. 5H.

The thickness of the solid solution layer 505 is coupled with the thickness of the metallic layer 504 and increases at a constant gradient and returns to the original thickness cyclically.

Since the carbon layer 502 was uniform as described above, where the solid solution layer 505 is thick, the carbon concentration is low, and where the solid solution layer 505 is thin, the carbon concentration is high. In the figure, the carbon concentration is expressed by gradation.

If an etching gas is supplied, while maintaining a solid solution temperature, the metal in the solid solution layer 505 is removed gradually. Although it is possible that the etching speed occasionally vary depending on the composition of the solid solution layer 505, as a general tendency, when an etching gas is supplied uniformly, a metal is removed at an approx similar speed irrespective of the thickness of the solid solution layer 505.

If the supply of an etching gas is continued together with heating, a zone appears, where carbon is not able to remain dissolved in the solid solution layer 505 due to removal of a metal. In the solid solution layer 505, where the thickness is small, the carbon concentration is high.

Figure 5I:
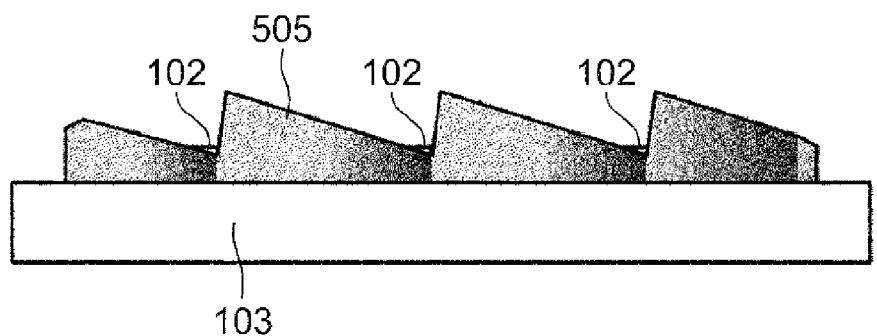
FIG. 5I is a cross-sectional view for illustrating a process for producing a graphene device.
Figure 5J:
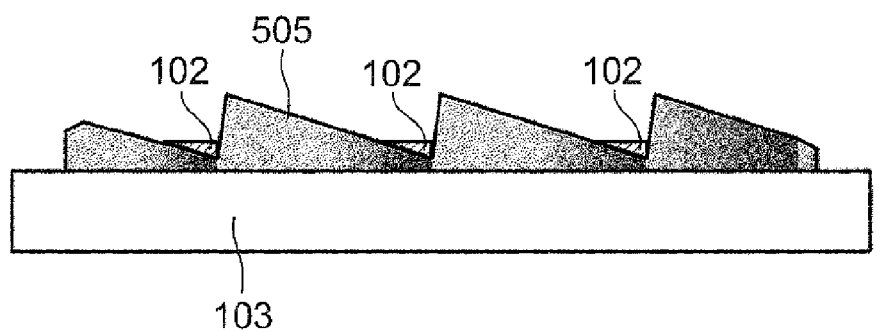
FIG. 5J is a cross-sectional view for illustrating a process for producing a graphene device.
Figure 5K:
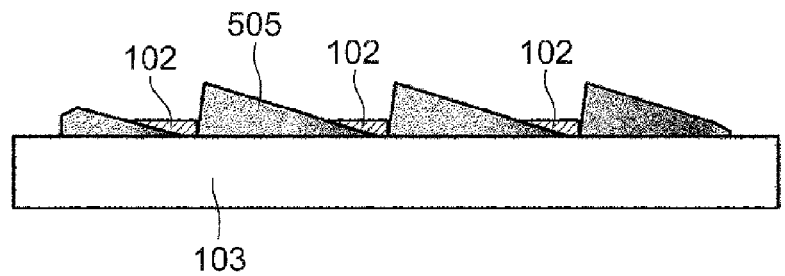
FIG. 5K is a cross-sectional view for illustrating a process for producing a graphene device.
Figure 5L:
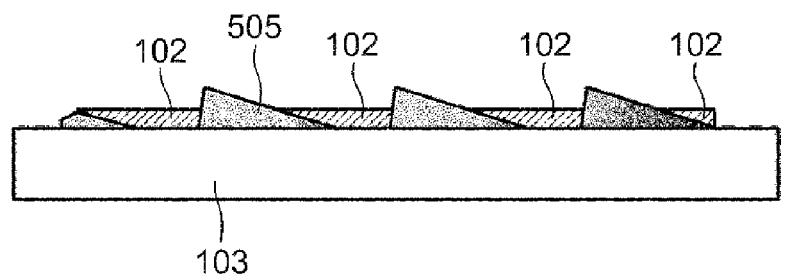
FIG. 5L is a cross-sectional view for illustrating a process for producing a graphene device.
Figure 5M:
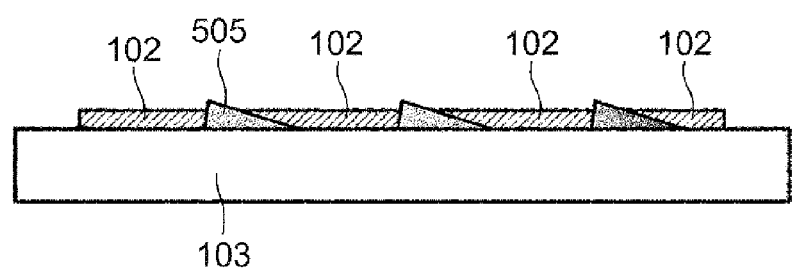
FIG. 5M is a cross-sectional view for illustrating a process for producing a graphene device.
Figure 5N:
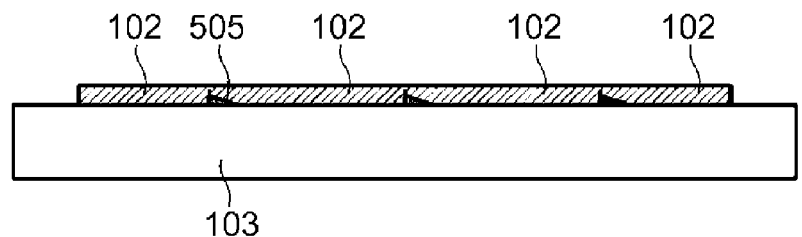
FIG. 5N is a cross-sectional view for illustrating a process for producing a graphene device.

Therefore, as shown in FIG. 5I, at a place where the thickness is small carbon unable to remain dissolved precipitates on a surface of the solid solution layer 505 as graphene 102. Namely, a place where the thickness is small, and the carbon concentration is high, forms a growth initiation position of the graphene 102.

If the heating to a solid solution temperature and the supply of the etching gas are continued even after carbon precipitates as the graphene 102, the graphene 102 grows while maintaining the crystal structure as shown in FIG. 5J, FIG. 5K, FIG. 5L, FIG. 5M, and FIG. 5N. The growing direction of the graphene 102 is a direction from a zone with a high carbon concentration to a zone with a low carbon concentration in the solid solution layer 505, namely a direction along the concentration gradient. In the present example, the graphene 102 grows from a place with a small thickness of the solid solution layer 505 to a place with a large thickness, namely from a place with a small thickness of the metallic layer 504 to a place with a large thickness, and from right to left in the figures.

By adjusting the partial pressure of an etching gas, the precipitation speed of the graphene 102 is able to be regulated. If the metal in the solid solution layer 505 is iron or the like, chlorine is able to be used as an etching gas, and the partial pressure of an etching gas is able to be adjusted by diluting chlorine to a desired concentration.

Figure 5O:
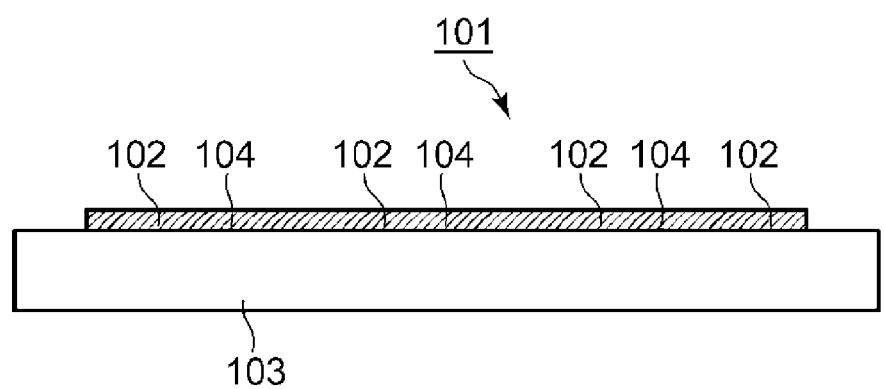
FIG. 5O is a cross-sectional view for illustrating a process for producing a graphene device.

In this way, when all the metal is removed from the solid solution layer 505, the graphene 102 touches directly the substrate 103 as shown in FIG. 5O. In this way, the graphene device 101 is completed.

A zone, where the thickness of the solid solution layer 505 was large, becomes a zone, where the graphene 102 grown from right collides with left adjacent graphene 102, and therefore a crystal grain boundary 104 appears from the surface of the graphene 102 to the surface of the substrate 103.

Further, as a zone, where a crystal grain boundary 104 appears, a growth initiation position of the graphene 102 is conceivable, and more details will be described in Examples described below.

Various variations of a production method for a graphene device 101 will be described briefly below. The variations thereof will be described in more detail in the following Examples.

First of all, formation of a second mask 503 is not prerequisite. For example, after forming the carbon layer 502 and without removing the first mask 501, it is possible that the metallic layer 504 be formed. Alternatively, after removing the first mask 501, it is possible that the metallic layer 504 be immediately formed covering the surfaces of the substrate 103 and the carbon layer 502.

If graphene 102 is to be formed on the entire surface of the substrate 103, the first mask 501 or the second mask 503 is not required to be formed. After the carbon layer 502 is formed over the entire surface of the substrate 103, the metallic layer 504 should be formed thereon.

Although in the above mode the carbon layer 502 and the metallic layer 504 are formed in separate stages, it is possible that a mixture of a carbon and a metal be supplied after the first mask 501 is formed. In this case, by removing the first mask 501 a mixture layer having the same shape with the desired pattern is obtained as an initial layer.

For forming such a mixture layer a co-deposition technique of a metal and carbon is able to be adopted. For example, sputtering is performed using simultaneously 2 targets, the one composed of a metal and the other composed of carbon. Alternatively, when sputtering is performed using a single target, it is possible that a target of a mixture of carbon and iron be used, or it is possible that sputtering be performed using a target composed of iron attached with a carbon chip, or it is possible that sputtering be performed using a target composed of carbon attached with an iron chip. In the mode using an attached chip, by adjusting the number of attached chips, the carbon concentration in a mixture layer as an initial layer is able to be easily adjusted.

It is possible that the order of formation of a carbon layer 502 and a metallic layer 504 be exchanged. Namely, a technique that the metallic layer 504 is formed on the substrate 103 and then the carbon layer 502 is formed on the metallic layer 504, is possible. In this case the carbon layer 502 corresponds to an initial layer.

Moreover there is a technique as below, by which the pattern shape of an initial layer is formed without utilizing the first mask 501 or the second mask 503. Namely, according to the technique, (a) the carbon layer 502 and the metallic layer 504 are formed, or (b) a mixture layer of carbon and a metal is formed, covering the surface of the substrate 103, and thereafter the metal and carbon are etched to form the pattern shape of an initial layer.

According to the technique, after the formation by (a) or (b), a third mask is formed. With respect to the third mask, the opening thereof corresponds to the masking part of the first mask 501, and the masking part corresponds to the opening of the first mask 501, and therefore the first mask 501 and the third mask constitute, a sort of, negative-positive relationship.

Then, etching is performed through the third mask for removing a metal and carbon in the openings of the third mask to form the pattern shape of an initial layer. Finally, the third mask is removed by etching. Thus, a metal and carbon are able to be formed to a desired pattern shape.

For forming a desired shape of an initial layer, there are various applicable pattern forming techniques in addition to the above. Consequently, carbon or a mixture of carbon and a metal, or the like is able to be used as a material for an initial layer. Further, as a developing solution for lithography, a material or a dissolving liquid for a resist, an etching agent, or the like, various materials are able to be used.

Further, if randomly generated crystals of graphene 102 are acceptable, it is not necessary to change the thickness of a metallic layer 504, and it is possible to be designed uniform.

Alternatively, if a crystal of graphene 102 is to be enlarged for forming a uniform continuous film, it should be so arranged that the concentration gradient of carbon is oriented to the same direction to the extent possible at any positions. A technique for obtaining a larger single crystal of graphene 102 will be described in the following Example.

According to the above mode the thickness of the carbon layer 502 is made uniform, on the other hand the supplied quantity of a metal is made inhomogeneous in terms of a position so as to change the thickness of the metallic layer 504 and to generate a gradient of the carbon concentration in the solid solution layer 505. However, for example, by making the supply quantity of carbon inhomogeneous in terms of the positions, or by changing the supply quantities of a metal and carbon in terms of the positions, it is possible that a gradient of the carbon concentration be generated to determine a growing direction of graphene 102.

Further, according to the above mode, by making the concentration distribution of an etching gas uniform, removal of a metal is carried out at a constant rate at any positions of the solid solution layer 505. However, by making the concentration distribution of an etching gas inhomogeneous, the speed of metal removal is able to be changed depending on the positions. Consequently, it is possible to design for causing precipitation of graphene 102 from a place with a higher concentration of an etching gas to a place with a lower concentration.

Example 3

According to the present embodiment, by applying the above embodiments in multi-stages, the size of a single crystal of the graphene 102 is adjusted, and the positions of crystal grain boundaries are defined, which is suitable, for example, for producing a graphene device 101 as shown in FIG. 2.

By a production method according to the present embodiment, line-shaped graphene is grown in the first direction on the substrate 103 using the production method for graphene of Example 2.

Figure 6A:
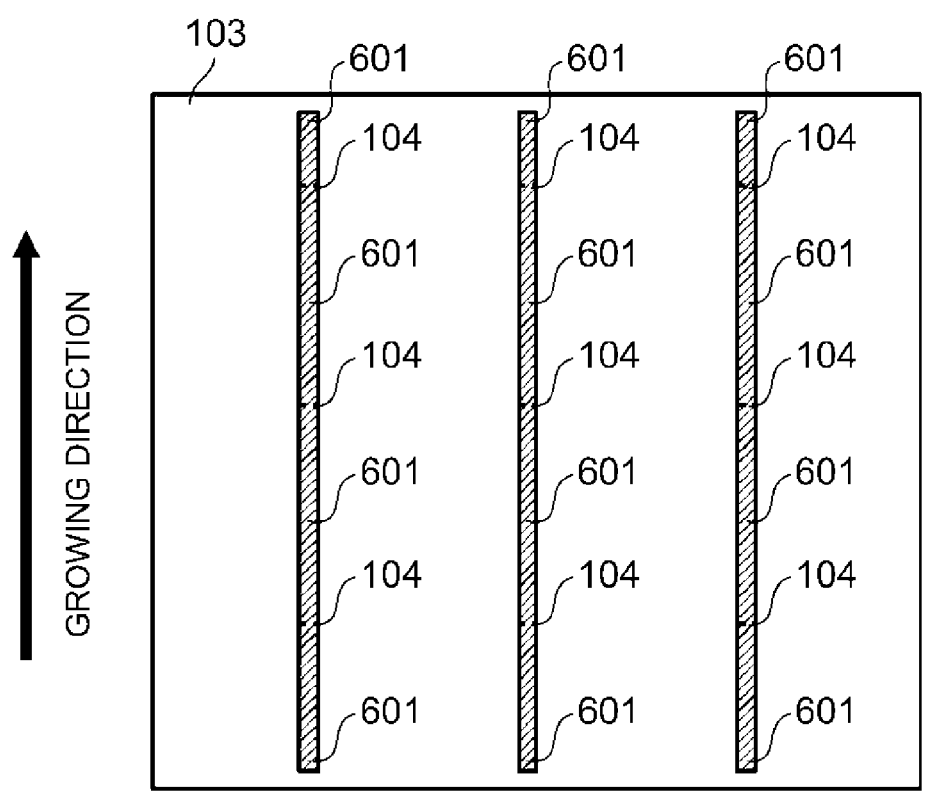
FIG. 6A is a plan view illustrating line-shaped graphene and the growing direction thereof.

FIG. 6A is a plan view illustrating line-shaped graphene and the growing direction thereof. The example will be described below referring to the figure.

In the example shown in the figure a large number of pieces of line-shaped graphene 601 divided by crystal grain boundaries 104 grow from the respective grid points on the substrate 103 toward the upward adjacent grid points.

To form such line-shaped graphene 601, the first mask 501 for the carbon layer 502, having openings in a form of an array of straight lines in a vertical direction at regular intervals, is used. As for the thickness of the metallic layer 504, such a pattern that the thickness increases gradually upward and then returns suddenly to the original thickness cyclically, is applied.

Next, using the production method for graphene in Example 2, a carbon layer 502 and a metallic layer 504 are formed in a region on the surface of the substrate 103, where the line-shaped graphene 601 has not been formed, and then planar graphene is allowed to grow in the second direction.

Figure 6B:
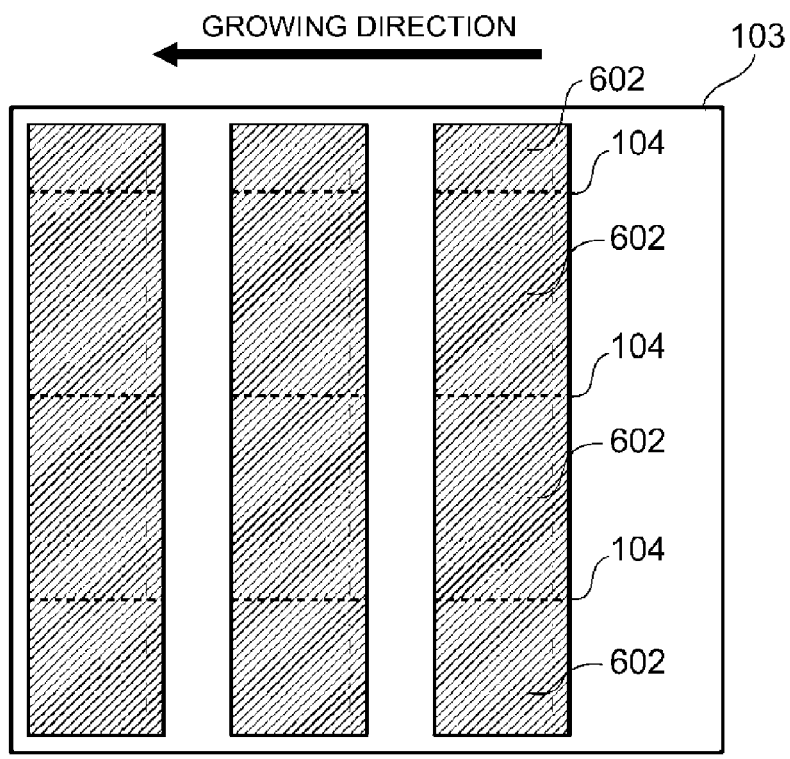
FIG. 6B is a plan view illustrating planar graphene and the growing direction thereof.

FIG. 6B is a plan view illustrating planar graphene and the growing direction thereof. The example will be described below referring to the figure.

The figure depicts a process in which planar graphene 602 grows from the respective pieces of line-shaped graphene 601 as initiation lines from right to left.

In order to grow the planar graphene 602 as in the present mode, the first mask 501 for the carbon layer 502 and the second mask 503 for the metallic layer 504 having openings corresponding to regions where the line-shaped graphene 601 is not formed are able to be used, or it is possible that the use of the first mask 501 or the second mask 503 be omitted.

As for the thickness of the metallic layer 504, such a cyclic pattern that the thickness increases gradually from the respective line-shaped graphene 601 toward the leftward adjacent line-shaped graphene 601 is applied.

In this case, the already formed line-shaped graphene 601 becomes a seed for forming a crystal of the planar graphene 602 (in FIG. 6B, 2-dotted broken lines indicate the borderlines where the line-shaped graphene 601 was located.).

By such an arrangement, the growing direction of the planar graphene 602 becomes from right to left.

This figure depicts the growth of the planar graphene 602 on the halfway, and the growth continues until the front edge of the planar graphene 602 finally reaches an adjacent planar graphene 602 (where the line-shaped graphene 601 was located before).

By forming the graphene 102 as above, a graphene device 101 with single crystals arranged in a grid pattern as illustrated in FIG. 2, in which line segments connecting adjacent grid points constitute crystal grain boundaries, is able to be produced.

In this case, the smaller the dimension of the grid square is, the shorter the production time for covering the substrate 103 becomes, although the dimension of the crystal of the graphene 102 becomes also smaller. Therefore it is possible that the dimension and the number of the grid squares be selected appropriately according to the end use or the production cost.

In the case only one line-shaped graphene 601 is formed from the lower edge to the upper edge of the substrate 103 and planar graphene 602 is grown from the line-shaped graphene 601 to the opposite edge of the substrate 103 facing to the line-shaped graphene 601, it is also possible to form a single crystal of graphene 102 covering the entire substrate 103.

In the following the variations of the production method described in the Example 2 will be described one by one. In the following descriptions, with respect to similar elements as in the above modes, descriptions are omitted appropriately to facilitate understanding Example 4

The present embodiment is a production method for a graphene device 101 forming the graphene 102 on the entire surface of the substrate 103.

According to the present embodiment a graphene device 101 as shown in FIG. 1A and FIG. 1B is able to be produced. FIG. 7A to FIG. 7F are diagrams illustrating a process of the production method for the graphene device 101 according to the present embodiment. The example will be described below referring to the figures.

Figure 7A:
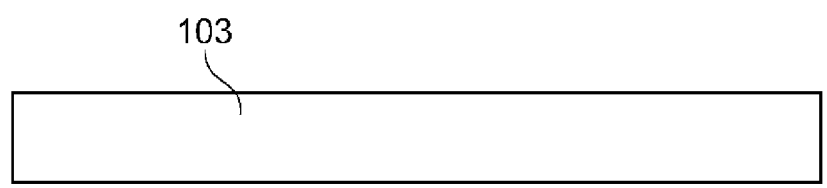
FIG. 7A is a diagram illustrating a process of a production method for a graphene device.
Figure 7B:
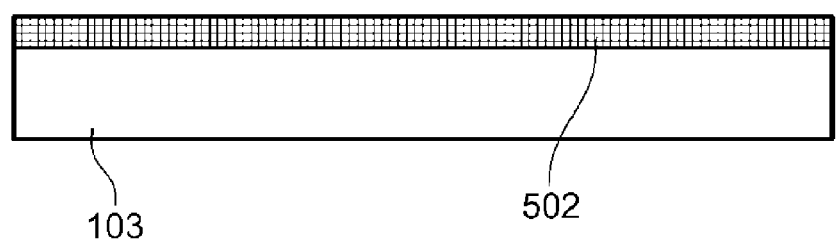
FIG. 7B is a diagram illustrating a process of a production method for a graphene device.

According to the present production method, the substrate 103 is prepared first of all (FIG. 7A).

Figure 7C:
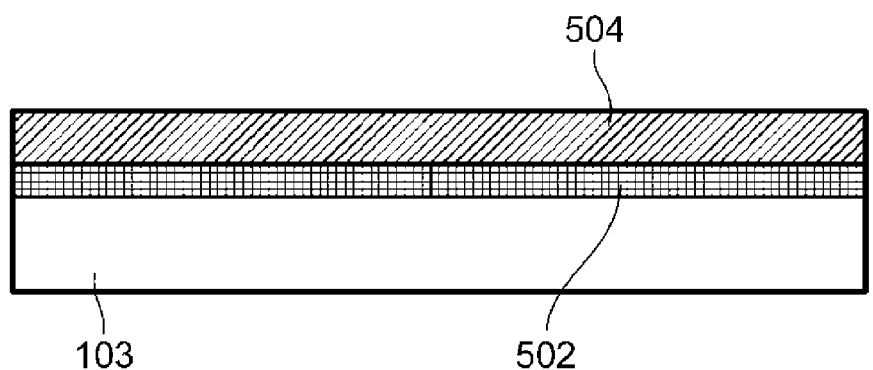
FIG. 7C is a diagram illustrating a process of a production method for a graphene device.

Then the carbon layer 502 is formed on the surface of the substrate 103 (FIG. 7B), and further the metallic layer 504 is formed (FIG. 7C). As described above, it is possible that the order of formation of the carbon layer 502 and the metallic layer 504 be reversed, or it is possible that a mixture layer be formed by means of sputtering, vapor deposition, CVD, or the like of a mixture of carbon and a metal.

Figure 7D:
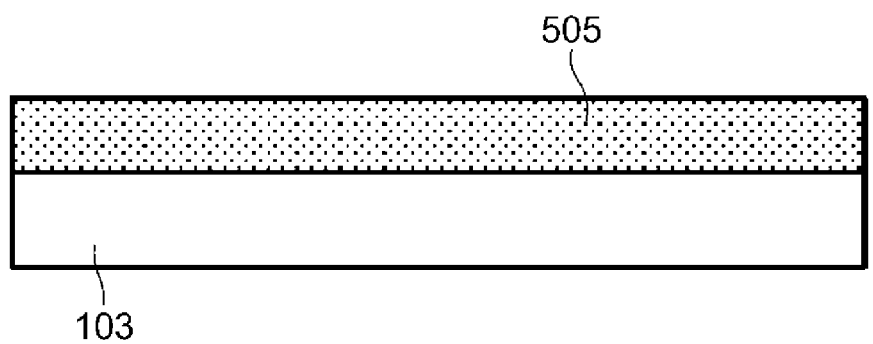
FIG. 7D is a diagram illustrating a process of a production method for a graphene device.

Thereafter, by conducting heating up to a solid solution temperature, the solid solution layer 505 dissolving carbon in a metal is formed (FIG. 7D).

Figure 7E:
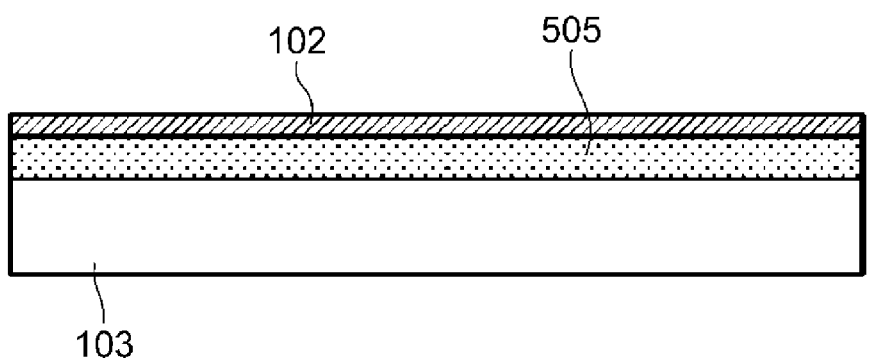
FIG. 7E is a diagram illustrating a process of a production method for a graphene device.

Further, a metal is etched from the solid solution layer 505 by supplying an etching gas, while continuing the heating, so that graphene 102 precipitate on the surface of the solid solution layer 505 and starts growing (FIG. 7E).

Figure 7F:
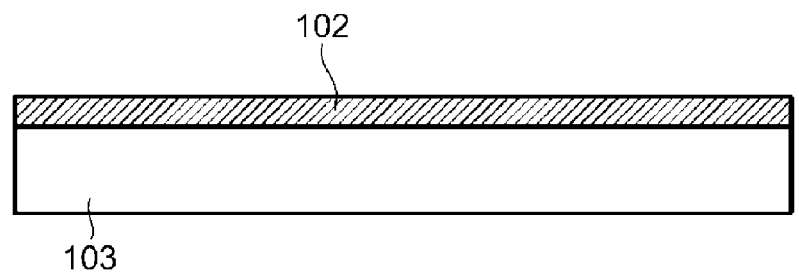
FIG. 7F is a diagram illustrating a process of a production method for a graphene device.

When all the metal is etched, a graphene device 101, in which the graphene 102 touches directly the surface of the substrate 103, is completed (FIG. 7F).

Example 5

This embodiment is a production method for a graphene device 101 without using the second mask 503. By this technique, for example, a graphene device 101 having a pattern as shown in FIG. 3 is able to be produced.

FIG. 8A to FIG. 8H are diagrams illustrating a process of a production method for a graphene device 101 according to the present embodiment. The example will be described below referring to the figures.

Figure 8A:
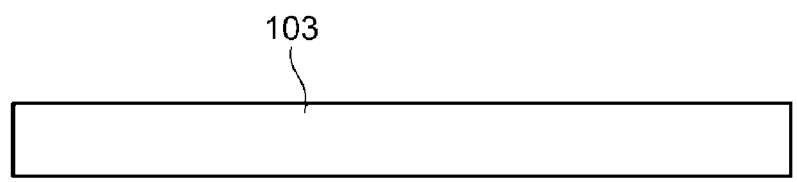
FIG. 8A is a diagram illustrating a process of a production method for a graphene device.

According to the present production method, the substrate 103 is prepared first of all (FIG. 8A).

Figure 8B:
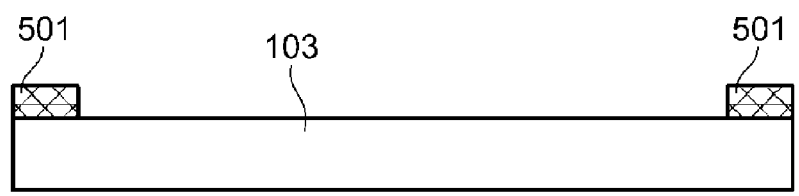
FIG. 8B is a diagram illustrating a process of a production method for a graphene device.
Figure 8C:
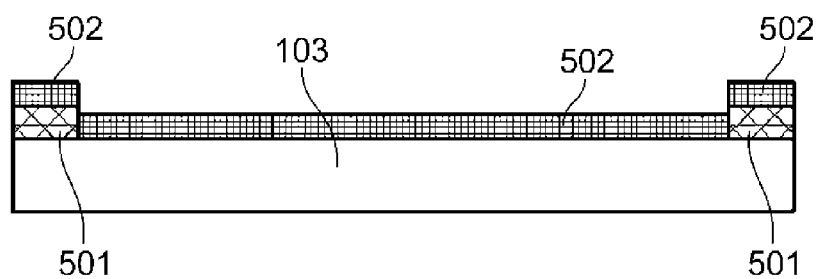
FIG. 8C is a diagram illustrating a process of a production method for a graphene device.
Figure 8D:
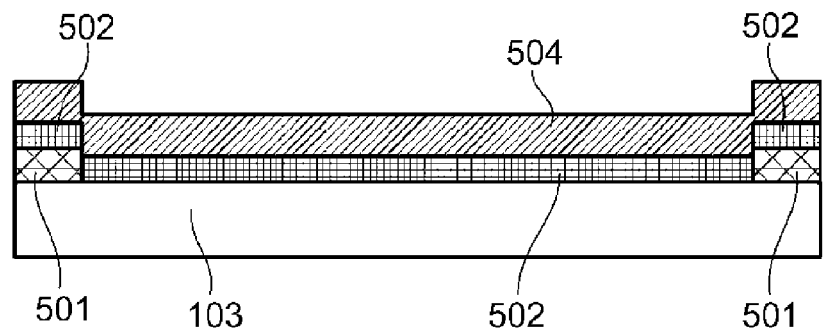
FIG. 8D is a diagram illustrating a process of a production method for a graphene device.

Next, the first mask 501 is formed on the surface of the substrate 103 (FIG. 8B). Thereafter, a carbon layer 502 is formed (FIG. 8C), and further a metallic layer 504 is formed (FIG. 8D).

Figure 8E:
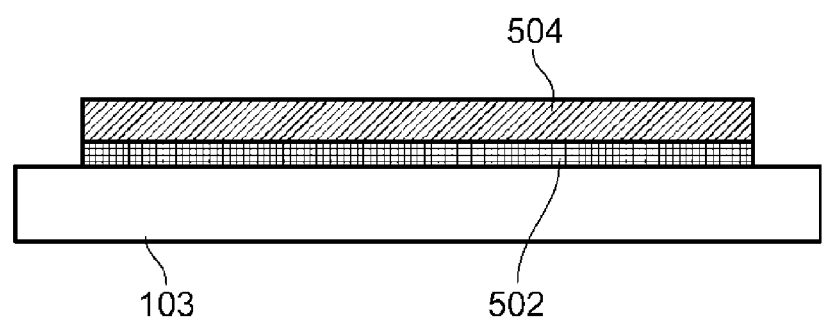
FIG. 8E is a diagram illustrating a process of a production method for a graphene device.

Then, by dissolving the first mask 501, the carbon layer 502 and the metallic layer 504 on the first mask 501 are removed (FIG. 8E).

After the formation of the carbon layer 502, it is possible that the first mask 501 and the carbon layer 502 be first removed, and then the metallic layer 504 is formed and it is possible that the following treatments be followed.

Figure 8F:
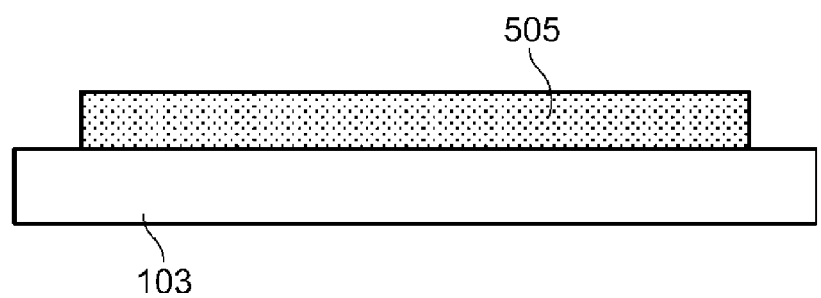
FIG. 8F is a diagram illustrating a process of a production method for a graphene device.

After the carbon layer 502 is formed to the same shape as a desired pattern shape by removal, heating to a solid solution temperature is conducted to form a solid solution layer 505 dissolving carbon in a metal (FIG. 8F).

Figure 8G:
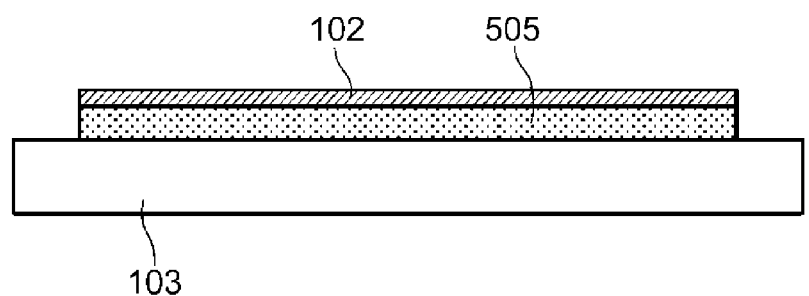
FIG. 8G is a diagram illustrating a process of a production method for a graphene device.

Further, a metal is etched from the solid solution layer 505 by supplying an etching gas, while keeping a solid solution temperature, so that graphene 102 precipitate on the surface of the solid solution layer 505 and starts growing (FIG. 8G).

Figure 8H:
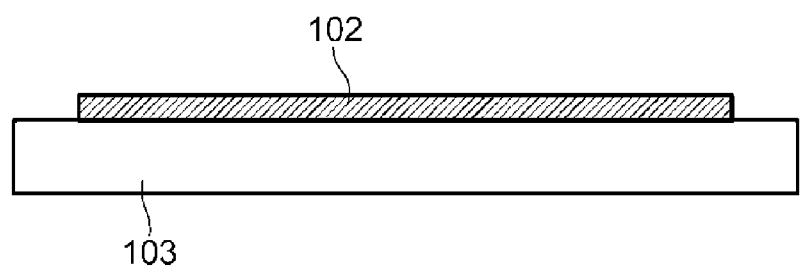
FIG. 8H is a diagram illustrating a process of a production method for a graphene device.

When all the metal is etched, a graphene device 101, in which the graphene 102 touches directly the surface of the substrate 103, is completed (FIG. 8H).

Example 6

This embodiment is a production method for a graphene device 101 without using the first mask 501 and the second mask 503. By this technique, for example, a graphene device 101 having a pattern as shown in FIG. 3 is able to be produced.

FIG. 9A to FIG. 9I are diagrams illustrating a process of a production method for a graphene device 101 according to the present embodiment. The example will be described below referring to the figures.

Figure 9A:
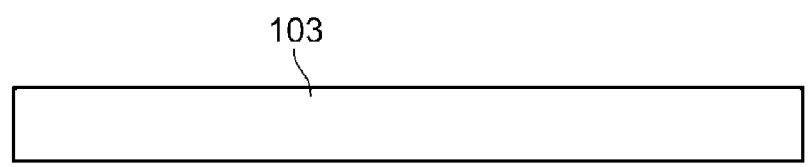
FIG. 9A is a diagram illustrating a process of a production method for a graphene device.
Figure 9B:
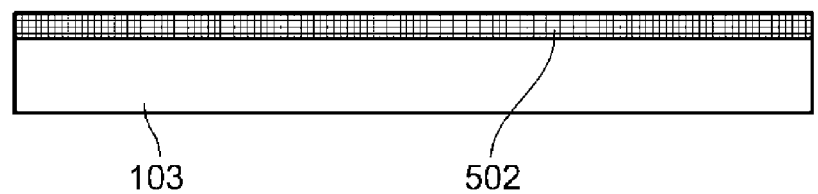
FIG. 9B is a diagram illustrating a process of a production method for a graphene device.

According to the present production method, the substrate 103 is prepared first of all (FIG. 9A).

Figure 9C:
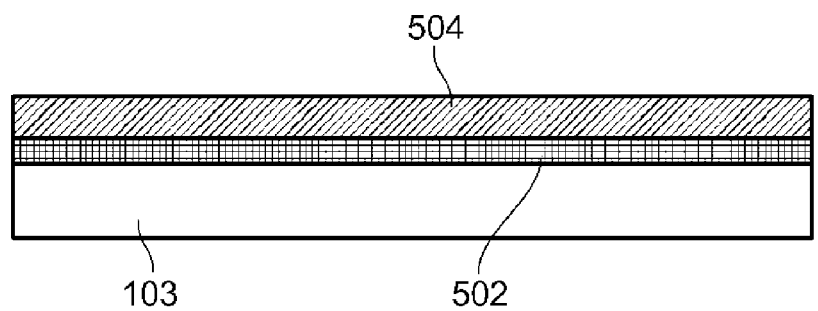
FIG. 9C is a diagram illustrating a process of a production method for a graphene device.

Next, the carbon layer 502 is formed on the surface of the substrate 103 (FIG. 9B), and further the metallic layer 504 is formed (FIG. 9C).

Figure 9E:
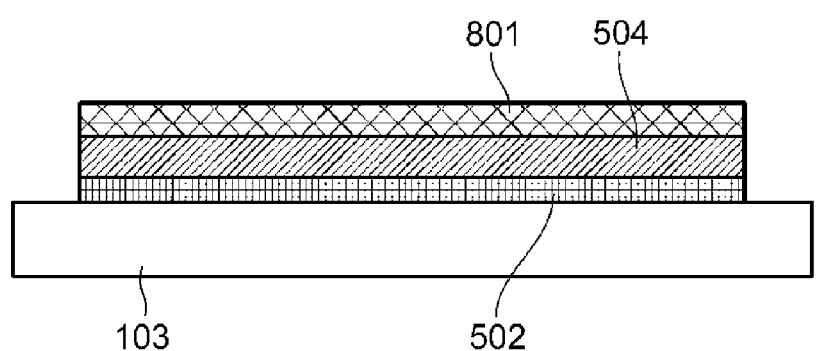
FIG. 9E is a diagram illustrating a process of a production method for a graphene device.
Figure 9D:
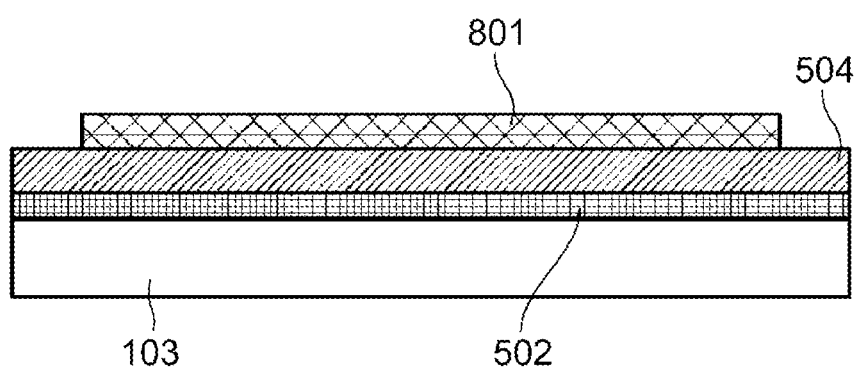
FIG. 9D is a diagram illustrating a process of a production method for a graphene device.

Then, a third mask 801 is formed on the metallic layer 504 (FIG. 9D). The third mask 801 is a mask in a negative-positive relationship with the first mask 501.

Thereafter, from the openings of the third mask 801 (exposed parts of the metallic layer 504) unnecessary parts of the metallic layer 504 and the carbon layer 502 are removed (FIG. 9E). For removing the metallic layer 504, plasma etching using a gas containing a halogen, or the like is able to be applied. For removing the carbon layer 502, plasma ashing using a gas containing oxygen, or the like is able to be applied.

Figure 9F:
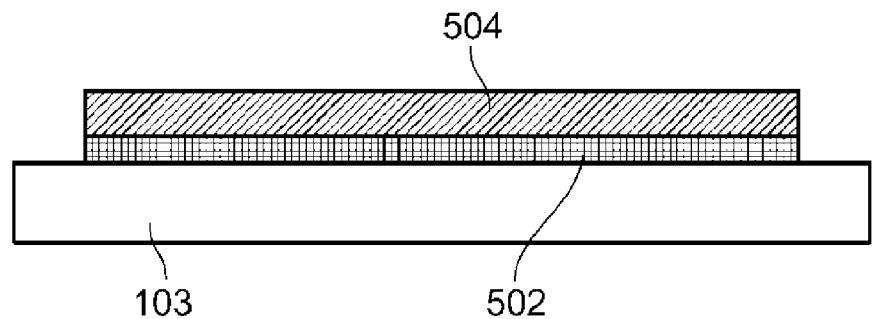
FIG. 9F is a diagram illustrating a process of a production method for a graphene device.

Further, the third mask 801 is removed (FIG. 9F).

Figure 9G:
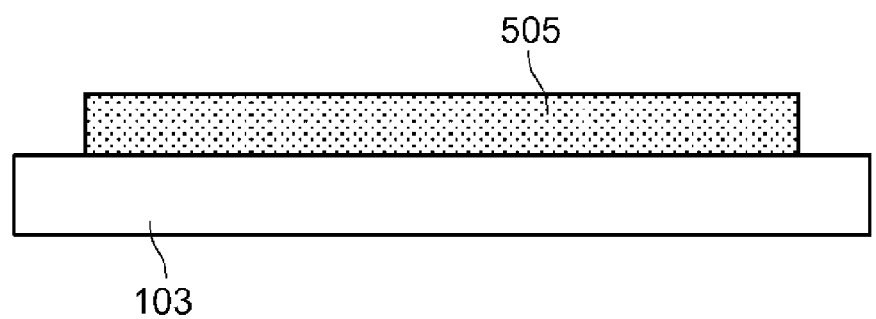
FIG. 9G is a diagram illustrating a process of a production method for a graphene device.

Thereafter, similarly as in the above embodiment, heating to a solid solution temperature is conducted to form a solid solution layer 505 dissolving carbon in a metal (FIG. 9G).

Figure 9H:
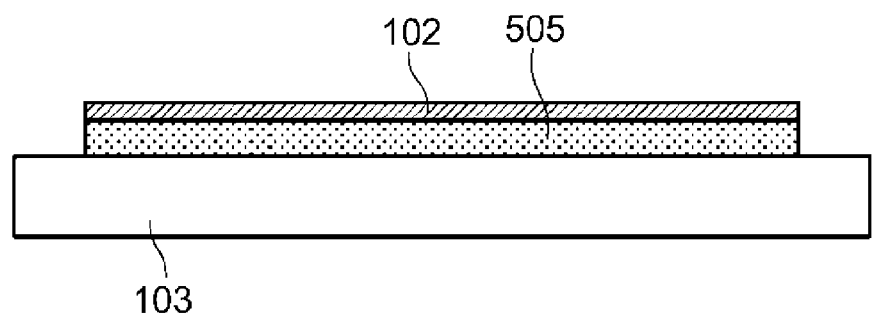
FIG. 9H is a diagram illustrating a process of a production method for a graphene device.

Further, a metal is etched from the solid solution layer 505 by supplying an etching gas, while continuing the heating, so that graphene 102 precipitate on the surface of the solid solution layer 505 and starts growing (FIG. 9H).

Figure 9I:
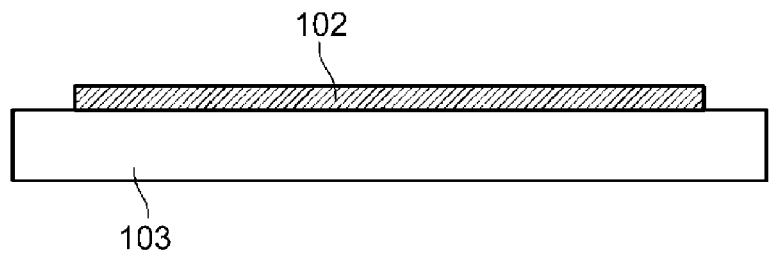
FIG. 9I is a diagram illustrating a process of a production method for a graphene device.

When all the metal is etched, a graphene device 101, in which the graphene 102 touches directly the surface of the substrate 103, is completed (FIG. 9I).

Example 7

This embodiment is a production method for a graphene device 101 by allowing graphene 102 to grow out of the solid solution layer 505 formed in the Examples 4, 5 or 6 from a desired position in a desired direction.

FIG. 10A to FIG. 10E are diagrams illustrating a process of a production method for a graphene device 101 according to the present embodiment. The example will be described below referring to the figures.

Figure 10A:
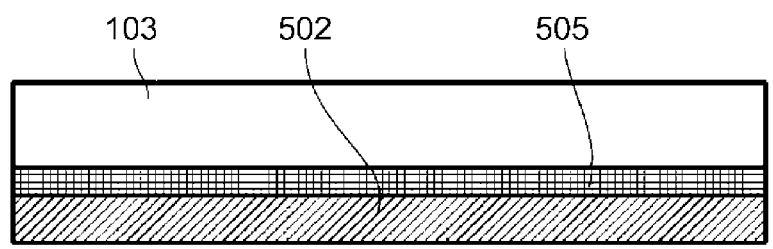
FIG. 10A is a diagram illustrating a process of a production method for a graphene device.
Figure 10A:
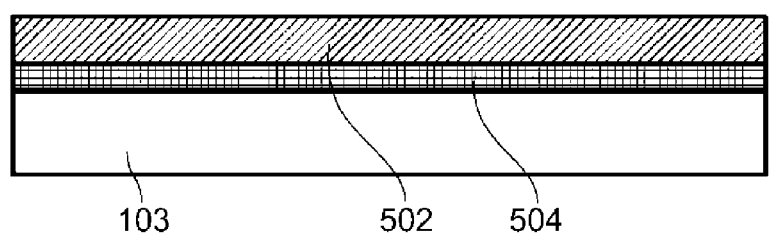

According to the present production method, 2 sheets of substrates 103 on which the carbon layer 502 and the metallic layer 504 are formed as in FIG. 7C, FIG. 8E, and FIG. 9F are prepared and placed facing each other (FIG. 10A).

Figure 10B:
FIG. 10B is a diagram illustrating a process of a production method for a graphene device.
Figure 10B:
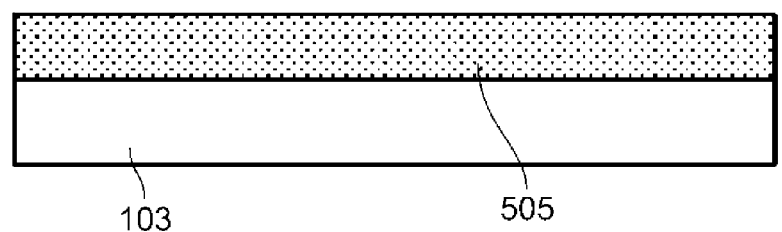

When heated to a solid solution temperature, solid solution layers 505 facing each other are formed on the substrates 103 facing each other similarly as in FIG. 7D, FIG. 8F, and FIG. 9G (FIG. 10B).

Figure 10C:
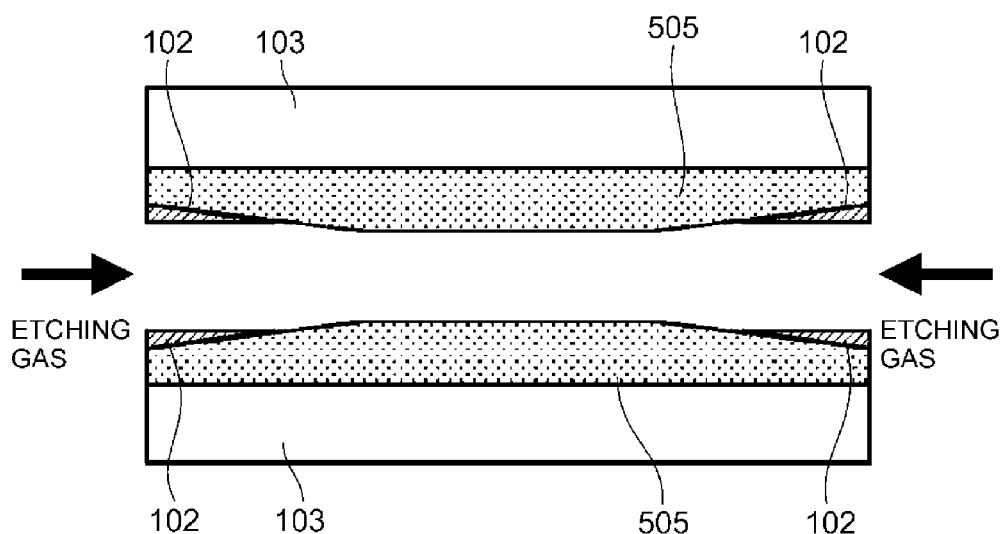
FIG. 10C is a diagram illustrating a process of a production method for a graphene device.
Figure 10D:
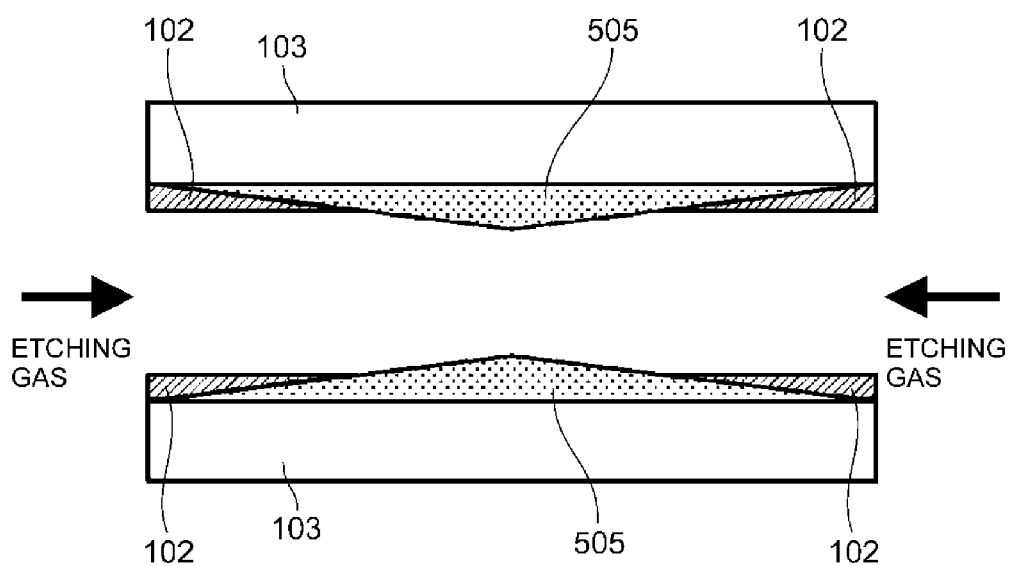
FIG. 10D is a diagram illustrating a process of a production method for a graphene device.

Thereafter, an etching gas is supplied from both ends of the substrates 103. In this case, a metal is removed faster at the edge parts of the solid solution layers 505 than the central parts of the solid solution layers 505. In other words, graphene 102 precipitates first at the edge parts of both the substrates 103 and the graphene 102 grows toward the central parts (FIG. 10C and FIG. 10D).

Figure 10E:
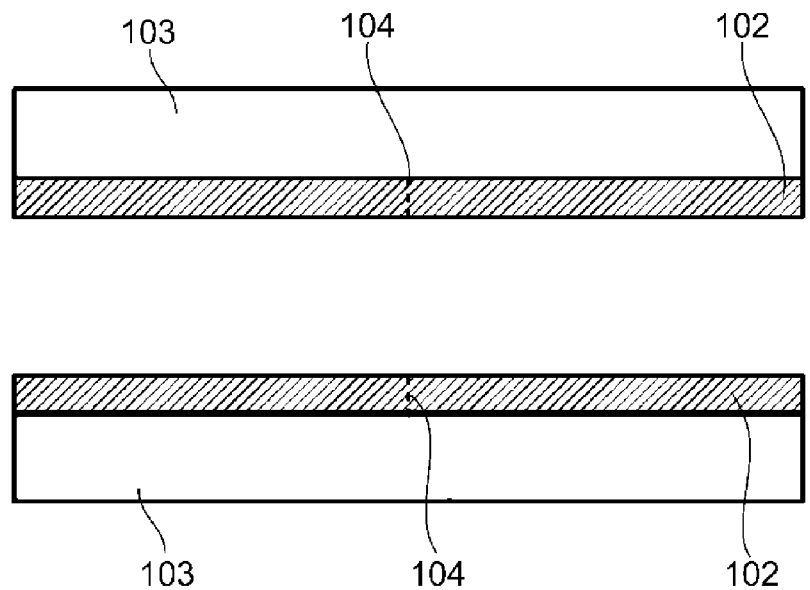
FIG. 10E is a diagram illustrating a process of a production method for a graphene device.

When all the metal is etched, a graphene device 101, in which the graphene 102 touches directly the surface of the substrate 103, is completed (FIG. 10E). In this graphene 102, crystal grain boundaries 104 appear at the central parts.

It is possible that the etching gas be supplied only from an end. In this case, the graphene 102 grows from the edge parts in the supply direction of the etching gas (flow direction or diffusion direction of the etching gas).

Example 8

This Example is a production method for a graphene device 101, by forming the carbon layer 502 as in the Examples 4, 5 and 6, thereafter forming the thickness of the metallic layer 504 inhomogeneous, and allowing graphene 102 to grow from a desired position in a desired direction.

Figure 11A:
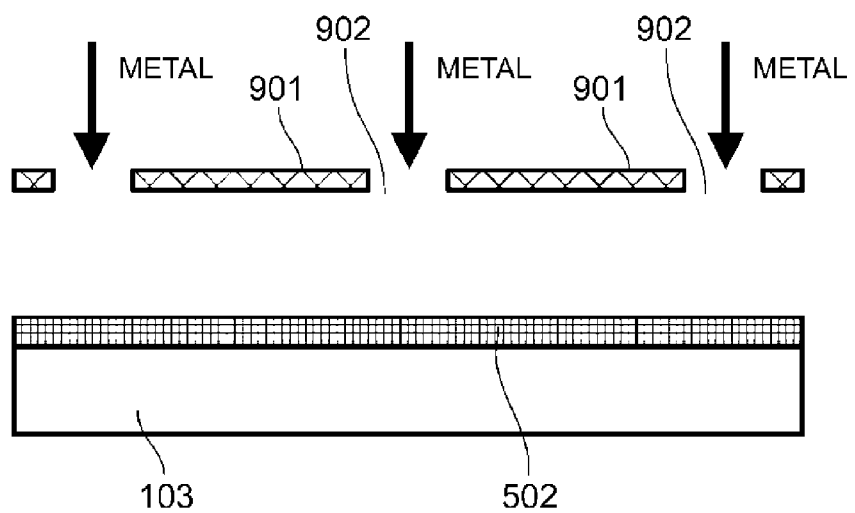
FIG. 11A is a diagram illustrating a process of a production method for a graphene device.

According to the present embodiment, the substrate 103, on which a carbon layer 502 is formed, is prepared (FIG. 11A).

Figure 11B:
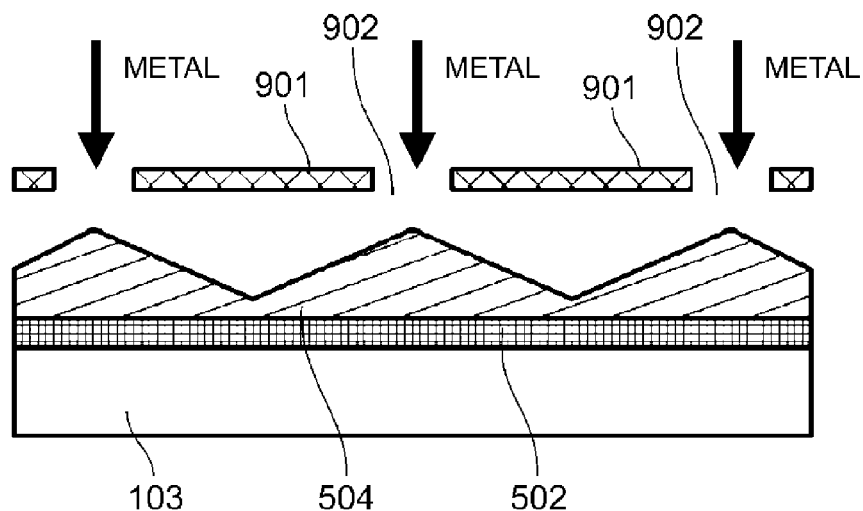
FIG. 11B is a diagram illustrating a process of a production method for a graphene device.

Then a self-supporting mask 901 (for example, a metal foil or the like provided with slits 902) is placed with a certain distance from the substrate 103 and the carbon layer 502, and a metal is supplied through the slits by vapor deposition, sputtering, CVD, or the like (FIG. 11B).

By doing so, a metallic layer 504 is formed thick in the vicinity of the slits 902, and with increased distance from the slits 902 the metallic layer 504 becomes thinner.

Although in Example 2, by regulating the sputtering direction in supplying a metal, the metallic layer 504 is formed to have a cross-section in a saw-toothed shape, in the present figure a metal is supplied from top to bottom and therefore the shape of the metallic layer 504 becomes bilaterally symmetrical.

If the present technique is applied to Example 4, the carbon layer 502 (and also the metallic layer 504) takes a desired shape at this stage.

If the present technique is applied to Example 5, after forming the metallic layer 504, the first mask 501 is detached and the carbon layer 502 (and also the metallic layer 504) is formed into a desired pattern shape.

If the present technique is applied to Example 6, thereafter the third mask 801 is formed, unnecessary parts of the carbon layer 502 and the metallic layer 504 are detached, and the third mask 801 is dissolved to form the carbon layer 502 (and also the metallic layer 504) into a desired pattern shape.

While, as described above, in the case the metallic layer 504 is formed by the present technique after the carbon layer 502 is formed in a desired pattern shape, it is not required to form the metallic layer 504 in a desired pattern shape.

Figure 11C:
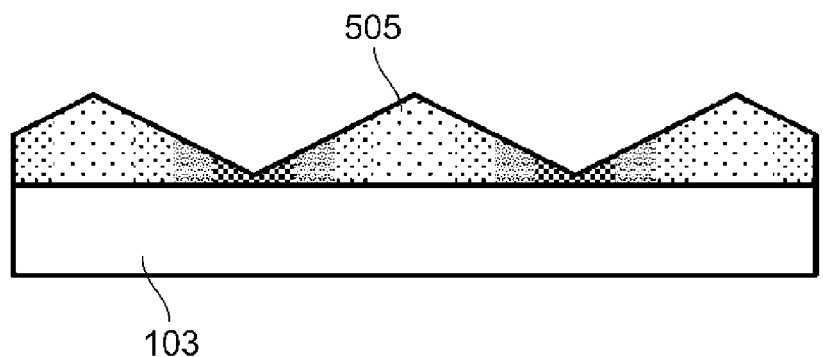
FIG. 11C is a diagram illustrating a process of a production method for a graphene device.
Figure 11D:
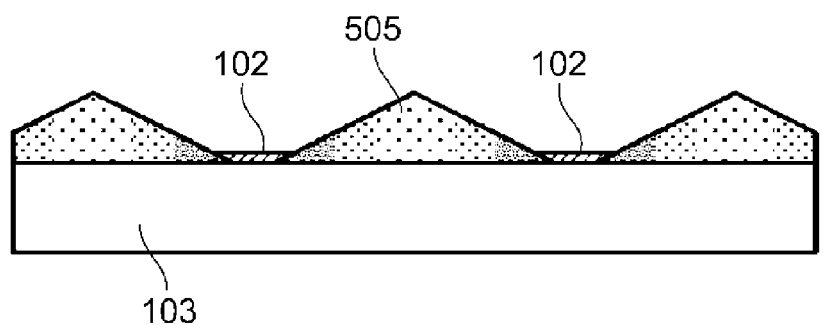
FIG. 11D is a diagram illustrating a process of a production method for a graphene device.
Figure 11E:
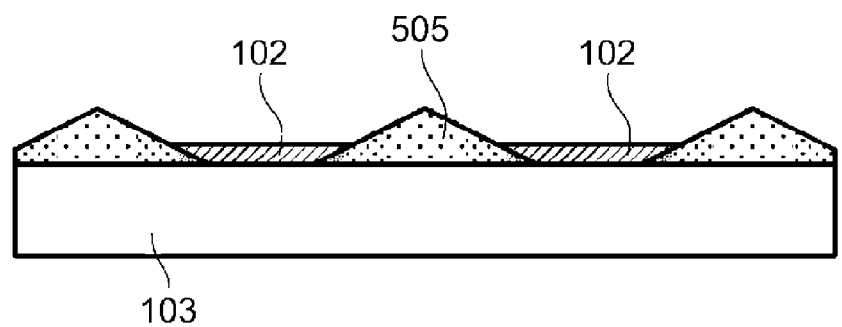
FIG. 11E is a diagram illustrating a process of a production method for a graphene device.
Figure 11F:
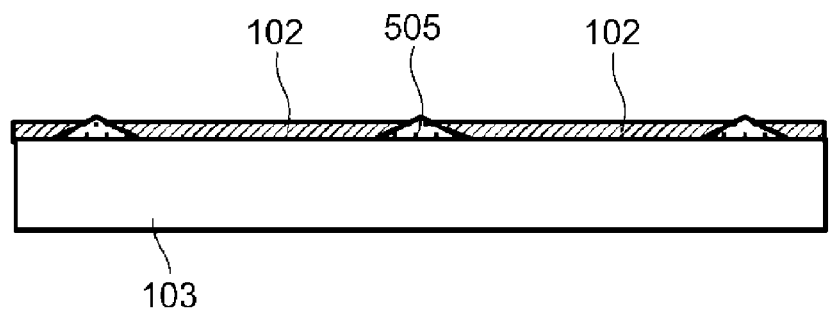
FIG. 11F is a diagram illustrating a process of a production method for a graphene device.

Thereafter, by conducting heating up to a solid solution temperature to form the solid solution layer 505 (FIG. 11C), and by supplying an etching gas, while continuing the heating, to remove a metal from the solid solution layer 505, graphene 102 precipitates at zones where the metallic layer 504 was thin and grows toward zones where the metallic layer 504 was thick (namely in the figures laterally) (FIGS. 11D, E and F).

Figure 11G:
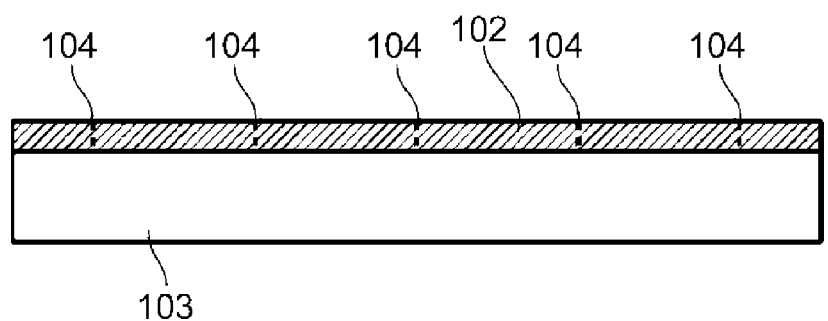
FIG. 11G is a diagram illustrating a process of a production method for a graphene device.

When all the metal is etched, a graphene device 101, in which the graphene 102 touches directly the surface of the substrate 103, is completed (FIG. 11G). In the example shown in the figures, at a central part, where the growing directions collide each other, crystal grain boundaries 104 of the graphene 102 appear. It is possible that the crystal grain boundaries 104 of the graphene 102 occasionally appear at growth initiation points.

Example 9

This Example is a production method, by which, in repeating Example 8 twice, the pattern shape of the carbon layer 502 is changed, and the direction of the self-supporting mask 901 is rotated by 90°, for producing a graphene device 101 having crystal grain boundaries 104 in a grid form as shown in FIG. 2.

FIG. 12A to FIG. 12F are plan views illustrating the position relationship according to the present embodiment among the carbon layer 502, the self-supporting mask 901, and the like. The example will be described below referring to the figures.

Figure 12A:
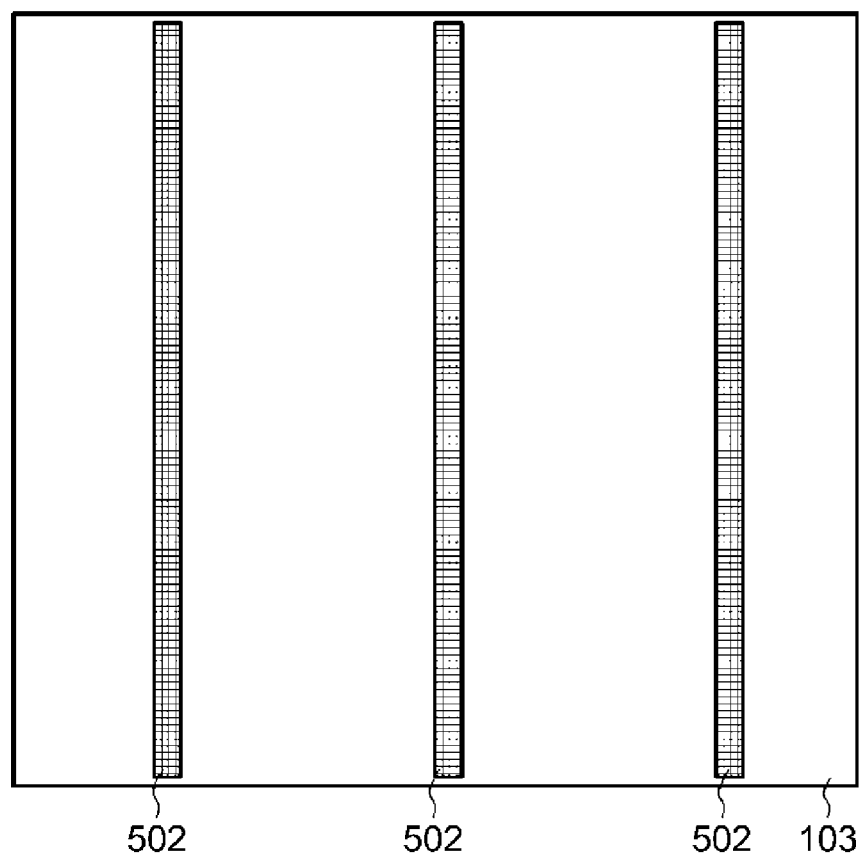
FIG. 12A is a diagram illustrating a process of a production method for a graphene device.

According to the present production method, a pattern of the carbon layer 502 is first formed on the surface of the substrate 103 as if parallel lines are drawn (FIG. 12A). In the figure, the pattern of the carbon layer 502 extends vertically.

Figure 12B:
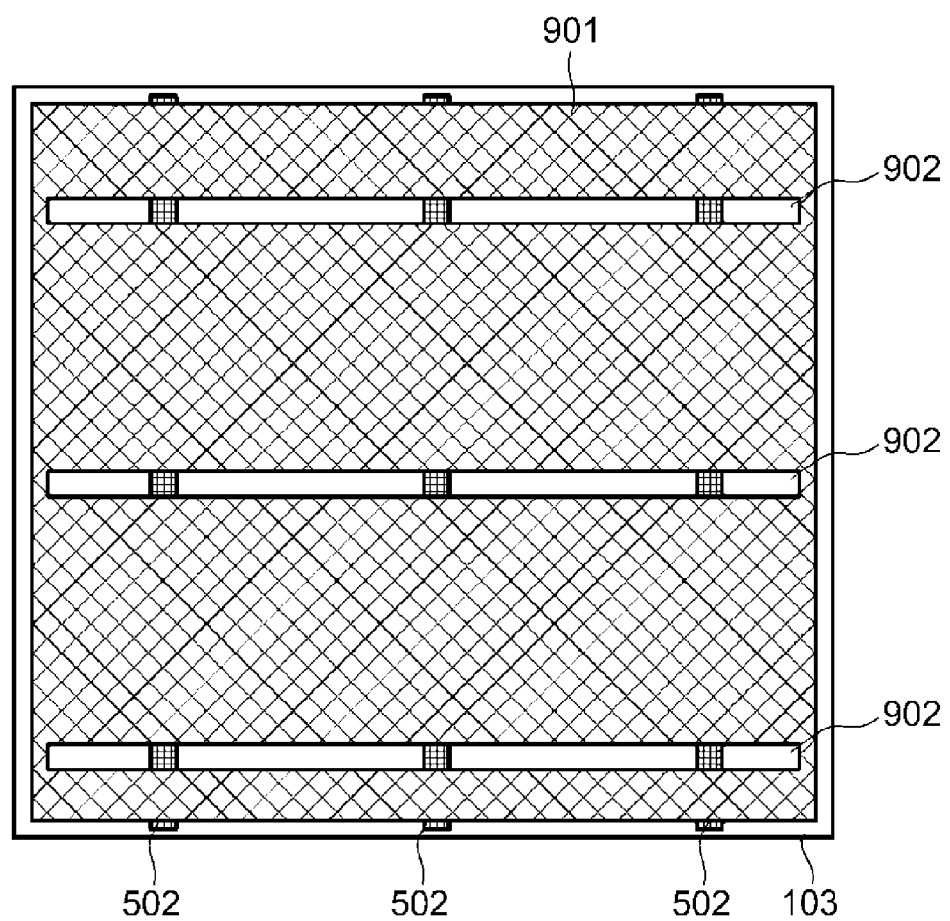
FIG. 12B is a diagram illustrating a process of a production method for a graphene device.

Then, based on the technique of Example 8, the self-supporting mask 901 is placed such that the slits 902 cross the pattern of the carbon layer 502 (FIG. 12B). Although, the self-supporting mask 901 is depicted smaller than the substrate 103 or the carbon layer 502 in the figure to facilitate understanding, the actual size is larger than them and the slits 902 are placed regularly and cyclically.

Then, a metal is supplied to form a metallic layer 504. In this case the thickness of the metallic layer 504 varies along the vertical direction of the figure.

By heating them the solid solution layer 505 is formed, and the metal is removed by etching. Then, the graphene 102 grows in a direction orthogonal to the longitudinal direction of the slit 902 of the self-supporting mask 901, namely vertically in the figure.

Figure 12C:
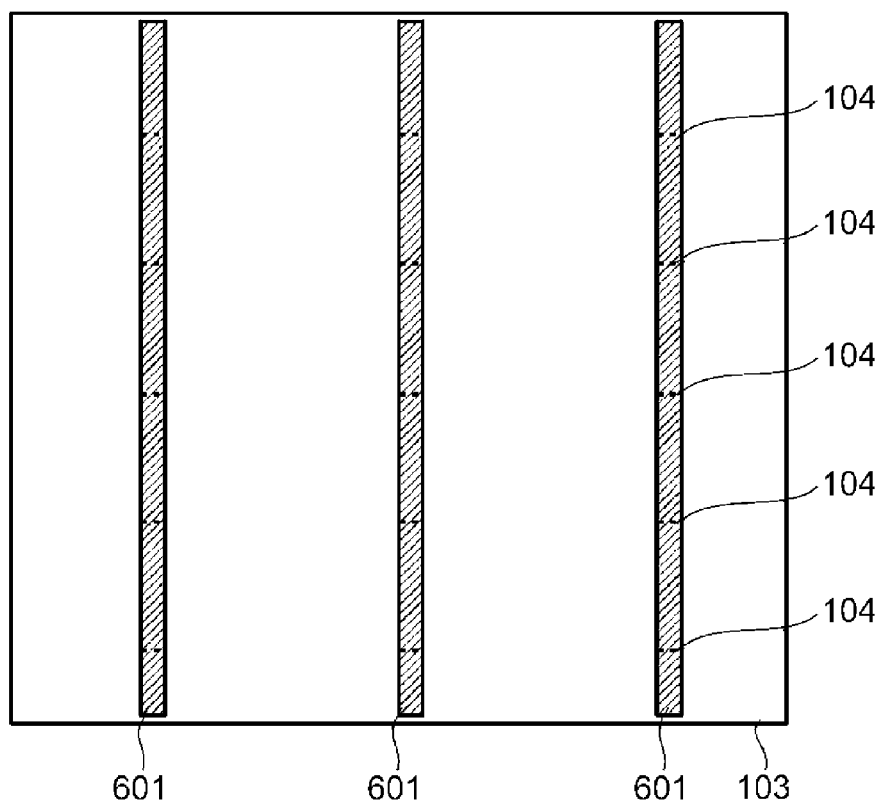
FIG. 12C is a diagram illustrating a process of a production method for a graphene device.

When the metal is removed totally, line-shaped graphene 601 is formed (FIG. 12C).

Figure 12D:
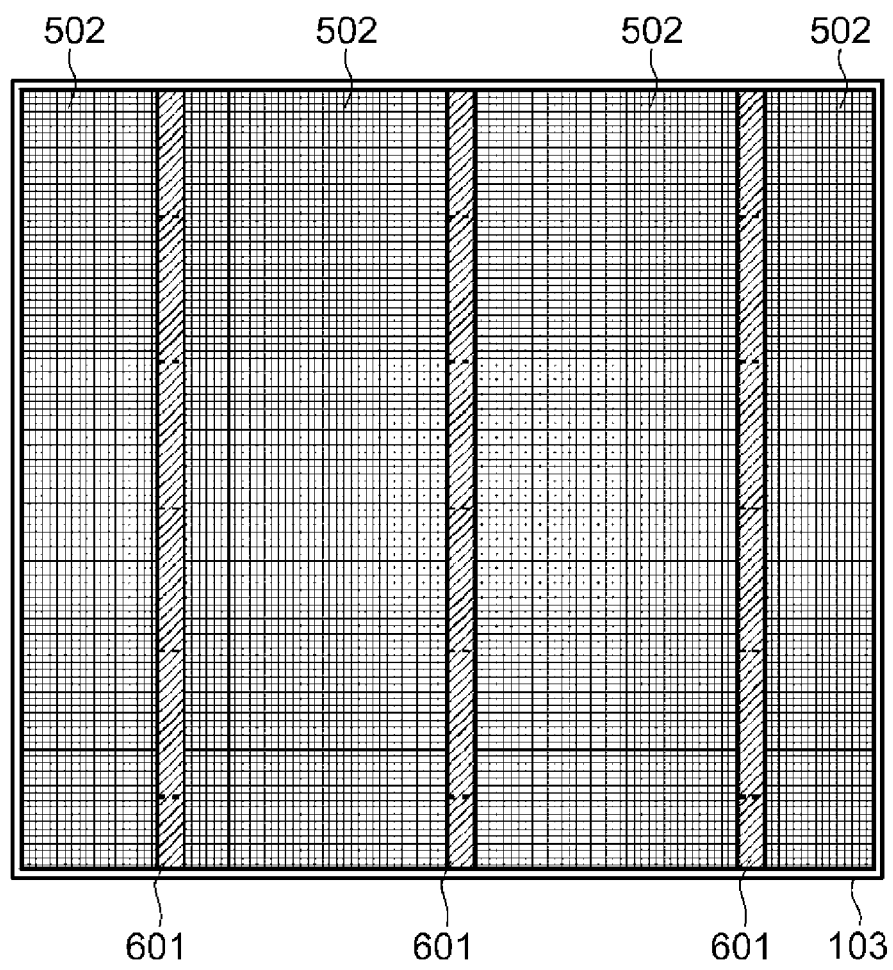
FIG. 12D is a diagram illustrating a process of a production method for a graphene device.

Thereafter, a pattern of the carbon layer 502 is formed on the substrate 103 outside the zones of line-shaped graphene 601 (FIG. 12D).

Figure 12E:
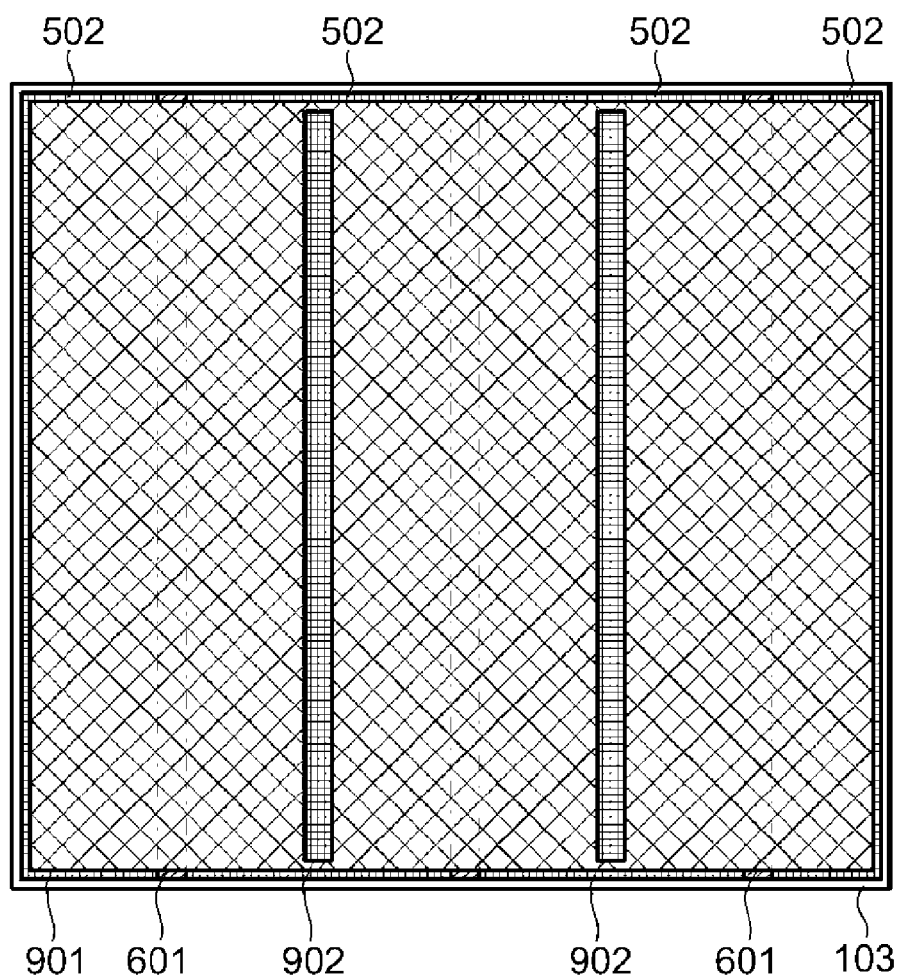
FIG. 12E is a diagram illustrating a process of a production method for a graphene device.

Then, based on the technique of Example 8, the self-supporting mask 901 is placed such that the slits 902 are parallel to the longitudinal direction of the line-shaped graphene 601, and the slits 902 are placed at the middle between two adjacent line-shaped graphene 601 (FIG. 12E).

Although, the self-supporting mask 901 is depicted smaller than the substrate 103 or the carbon layer 502 in the figure to facilitate understanding, the actual size is larger than them and the slits 902 are placed regularly and cyclically.

Then, a metal is supplied to form a metallic layer 504. In this case the thickness of the metallic layer 504 varies along the horizontal direction of the figure.

In this regard, in order to prevent formation of a metallic layer 504 on the line-shaped graphene 601, it is possible that a mask or the like be utilized appropriately. Further, it is possible to be so constituted that a part of the line-shaped graphene 601 is able to remain without dissolving in the metallic layer 504, by adjusting the supplied quantity of the metal, the size of the slits 902 of the self-supporting mask 901, or the distance to the substrate 103.

Then, by heating them the solid solution layer 505 is formed, and the metal is removed by etching.

Then, planar graphene 602 grows from the line-shaped graphene 601 that has remained without dissolving in the solid solution layer 505 as the initiation position in a direction orthogonal to the longitudinal direction of the slit 902 of the self-supporting mask 901, namely perpendicular to the longitudinal direction of the line-shaped graphene 601, and horizontally in the figure.

Figure 12F:
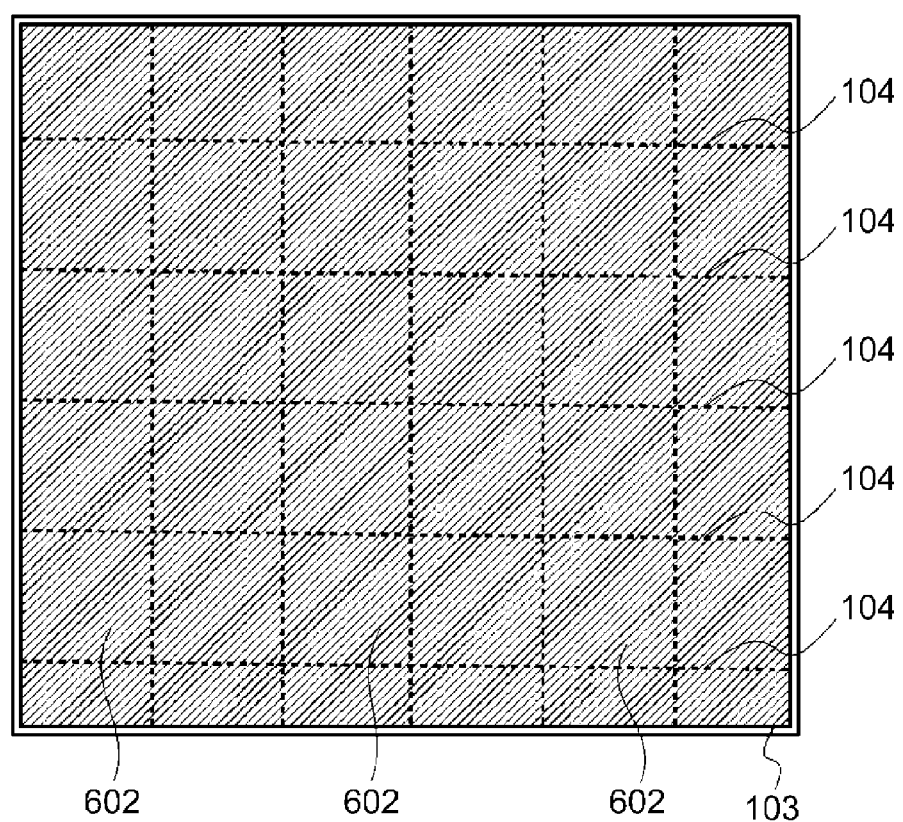
FIG. 12F is a diagram illustrating a process of a production method for a graphene device.

When the metal is removed totally, planar graphene 602 divided by crystal grain boundaries 104 in a grid form is formed (FIG. 12F).

Example 10

Experimental examples with various parameters with respect to the respective modes above, and experimental results with respect to characteristics of graphene devices to be yielded according to the parameters, will be described below.

EXPERIMENT 1

In Experiment 1 specific parameters with respect to the technique of Example 4 were examined.

As the substrate 103, a silicon substrate with a thermally oxidized film with the thickness of 1000 nanometers was adopted.

According to the parameters, an amorphous carbon layer 502 with the thickness of 40 nanometers was formed by sputtering. A metallic layer 504 made of iron with the thickness of 83 nanometers is formed thereon by sputtering.

They were placed in a reactor; then the reactor was evacuated to vacuum, and, flowing a mixture gas of hydrogen and argon (hydrogen content: 40 vol-%) at a total pressure of 5 Torr, heated up to a solid solution temperature range (600° C. to 1000° C., a typical solid solution temperature is 800° C.); the temperature was maintained for 10 min; and annealing was conducted to form a solid solution layer 505.

Thereafter, keeping the heating at a solid solution temperature, the supplied gas was switched to a mixture gas of chlorine and argon (chlorine content: 0.01 vol-%) and flown at a total pressure of 5 Torr for 30 min for etching a metal.

After the completion of metal removal, the heating was terminated to cool down the reactor, and the graphene 102 formed on the surface of the substrate 103 was analyzed.

Under the parameters, the average film thickness of the solid solution layer 505 was decreased at a constant rate with elapsed time, and the etching rate was 21 nanometers per min.

If a metallic layer 504 alone is etched under similar conditions, the etching rate is almost same as a solid solution layer 505, but if a carbon layer 502 alone is etched under similar conditions, the thickness of the carbon layer 502 does not change.

In other words, if an etching gas is supplied keeping the heating at a solid solution temperature, a metal is able to be removed preferentially from the solid solution layer 505.

By Raman scattering spectroscopy, from a G-band originated from a crystal structure, a D-band originated from an amorphous structure, and a G'-band originated from graphene, as well as intensities thereof, it is able to be estimated to what extent amorphous carbon is converted to crystalline graphene 102, or what is an approximate layer number of the graphene 102.

Figure 13A:
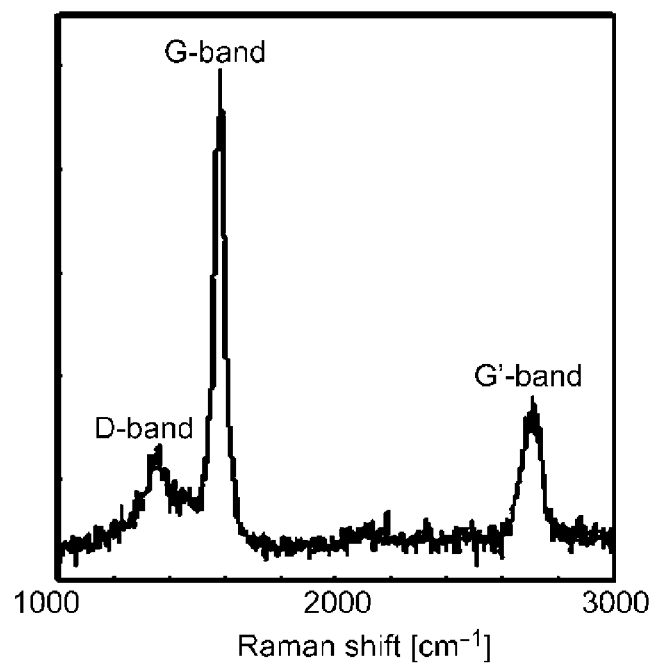
FIG. 13A is a graph showing a Raman spectrum in the event a solid solution layer is formed and then quenched without etching.
Figure 13B:
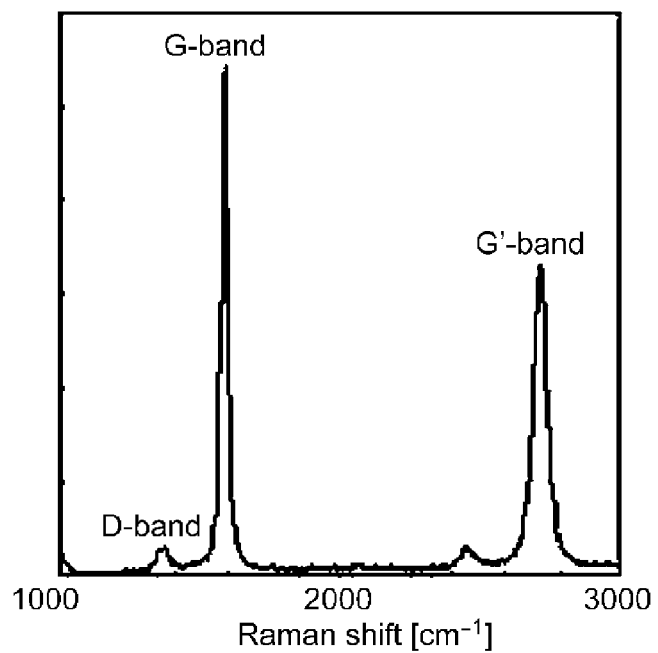
FIG. 13B is a graph showing a Raman spectrum in the event a production method according to the present embodiment is used.

FIG. 13A is a graph showing a Raman spectrum in the event a solid solution layer 505 is formed and then quenched without etching, and FIG. 13B is a graph showing a Raman spectrum in the event a production method with the parameters according to the present embodiment is used. The example will be described below referring to the figures.

The abscissa of the graphs shown in the figures represents Raman shift from $1000\ cm^{-1}$ to $3000\ cm^{-1}$, and the ordinate represents intensity of the spectrum.

In FIG. 13A corresponding to a conventional technique, besides G-band and D-band, peaks of amorphous carbon appear over a broad range between the two bands.

On the other hand, in FIG. 13B according to the present invention, G-band originated from a crystal structure becomes sharp and high, and D-band originated from defects becomes small. Further, peaks of amorphous carbon between the two bands are remarkably reduced.

Further, G'-band originated from graphene in the graphene 102 becomes also sharp and high.

Further, by fluorescent X-ray analysis, a metal is below the detection limit, while it became clear that the thickness of the graphene 102 was 19 nanometers.

On the other hand, according to a conventional technique corresponding to FIG. 13A, a large amount of iron corresponding to the thickness of 83 nanometers remains under low-crystallinity graphene.

Consequently, in contrast to a conventional technique, by the technique according to the present invention, it is clear that high-crystallinity high purity graphen102 not containing a catalyst metal is obtained touching directly the silicon substrate 103 with a thermally oxidized film.

EXPERIMENT 2

Following Experiment 1, specific parameters were further examined in Experiment 2.

Namely, in order to form a solid solution layer 505 dissolving carbon in iron, a carbon layer 502 with the thickness of 113 nanometers was formed firstly, and a metallic layer 504 was formed thereon, followed by heating. With respect to such a mode, change of the characteristics of the graphene 10 depending on the thickness of the metallic layer 504 was examined As the thickness of the metallic layer 504, 4 values of 83 nanometers, 132 nanometers, 233 nanometers, and 393 nanometers were applied.

Figure 14:
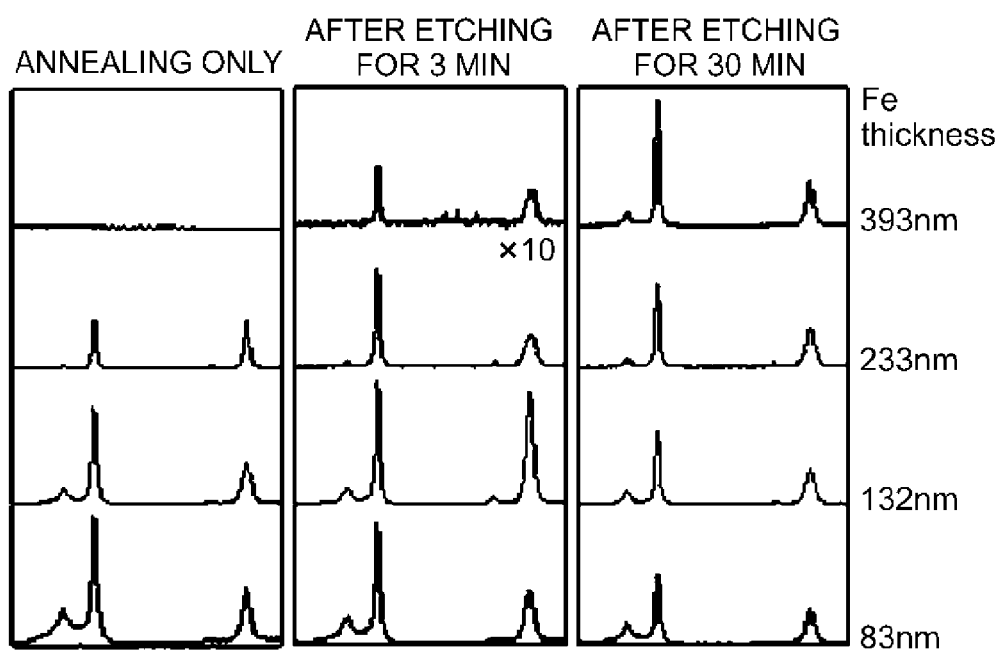
FIG. 14 is graphs showing features of Raman spectra for metallic layers with various thicknesses, which are cooled after annealing, after etching for 3 min, and after etching for 30 min.

FIG. 14 is graphs showing features of Raman spectra for metallic layers with various thicknesses, which are cooled after annealing, after etching for 3 min, and after etching for 30 min The example will be described below referring to the figure.

The abscissa of the respective graphs shown in the figure represents, similarly as in FIGS. 13A and 13B, Raman shift from 1000 $cm^{-1}$ to 3000 $cm^{-1}$, and the ordinate represents intensity of the spectrum.

As shown in the figure, with respect to the metallic layer 504 with the thickness of 393 nanometers, by annealing only carbon does not precipitate onto the surface and a peak originated from graphene is almost absent, but with the progress of etching precipitation of graphene advances.

With respect to the condition of the metallic layer 504 with the thickness of 233 nanometers, 132 nanometers, or 83 nanometers, a multilayer graphene layer is already precipitated after annealing.

With respect to the metallic layer 504 with the thickness of 233 nanometers, 3 min after the etching the best spectrum is obtained.

On the other hand, with respect to the metallic layer 504 with the thickness of 132 nanometers or 83 nanometers, longer etching does not change the spectrum. This is conceivably because with a small thickness of the metallic layer 504 an amount of dissolved carbon is limited and therefore an amount that precipitates by etching is also limited.

Surfaces of the samples were observed by a scanning electron microscope to find that between after annealing and after etching for 3 min, there was little change in terms of the surface smoothness and the number of voids irrespective of the thickness of the metallic layer 504, but after etching for 30 min the surface roughness and the number of voids increased.

With respect to the metallic layer 504 with the thickness of 393 nanometers, after the completion of etching for 30 min the film of graphene 102 becomes discontinuous, and it was the metallic layer 504 with the thickness of 233 nanometers that had the least number of voids and the largest size of crystal.

From the experiments it is expected that the thickness of a metallic layer 504 made of iron is preferably approx. 1.0-fold to 2.5-fold that of a carbon layer 502, if etching is conducted at 800° C.

While, there is a breadth for a solid solution temperature from the lower limit to the upper limit, and moreover it varies by the carbon concentration in a metal or a metal type. Therefore, it is possible to change the heating temperature in etching. It is conceivable that, if the temperature in etching is set high, a preferable thickness of a metallic layer 504 is smaller, and if the temperature is etching is set low, a preferable thickness of a metallic layer 504 is larger.

EXPERIMENT 3

In Experiment 3 specific parameters with respect to Examples 5 and 6 were examined.

As the substrate 103 a silicon substrate with an oxidized film was adopted, the first mask 501 was formed by ultraviolet light lithography, the carbon layer 502 and the metallic layer 504 were coated thereon by sputtering, and a resist of the first mask 501 was removed to produce an initial layer pattern with the line width of 2 μm.

The thickness of the carbon layer 502 was made 33 nanometers, and for the metallic layer 504 two kinds of 68 nanometers (parameters A), and 39 nanometers (parameters B) were prepared.

Setting other parameters as in the above Experiments, the graphene 102 was formed on the substrate 103.

Figure 15A:
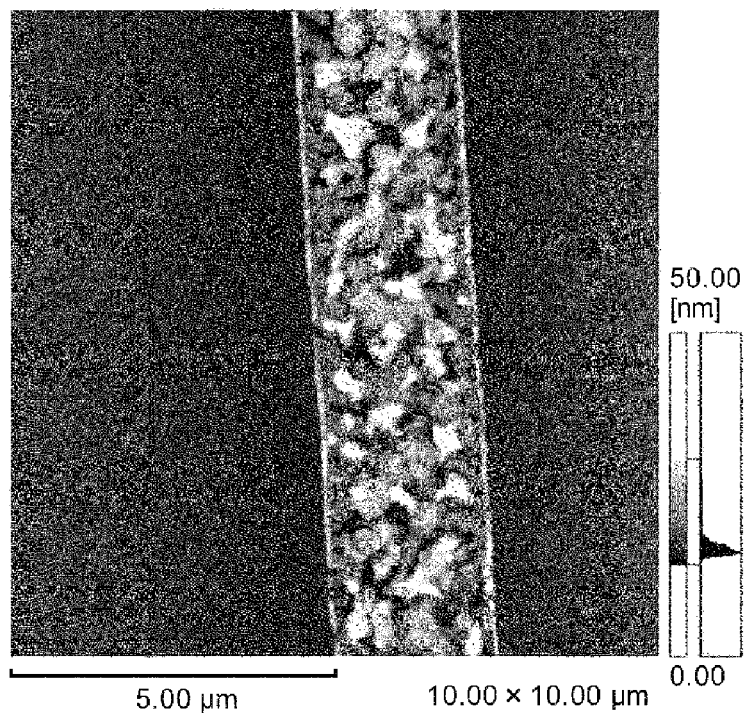
FIG. 15A is a diagram showing an atomic force microscope image of patterned graphene produced according to parameters A.
Figure 15B:
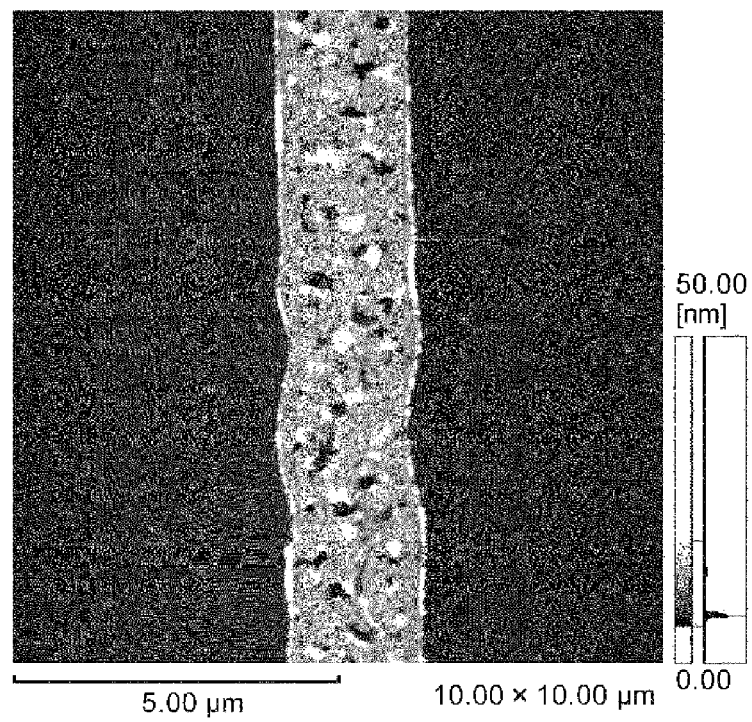
FIG. 15B is a diagram showing an atomic force microscope image of patterned graphene produced according to parameters B.

FIG. 15A is a diagram showing an atomic force microscope image of patterned graphene 102 produced according to parameters A. FIG. 15B is a diagram showing an atomic force microscope image of patterned graphene 102 produced according to parameters B. The example will be described below referring to the figures.

As obvious from the figures, parameters A give higher roughness compared to parameters B. While, the resistivity at the core part in the case of parameters A was $4\times10^{-3}$ Ωcm, and in the case of parameters B was $6\times10^{-3}$ Ωcm.

Namely, in the case of parameters A, since the metallic layer 504 is thick, the crystallinity is high and the resistance is low, but the roughness is high.

Figure 16A:
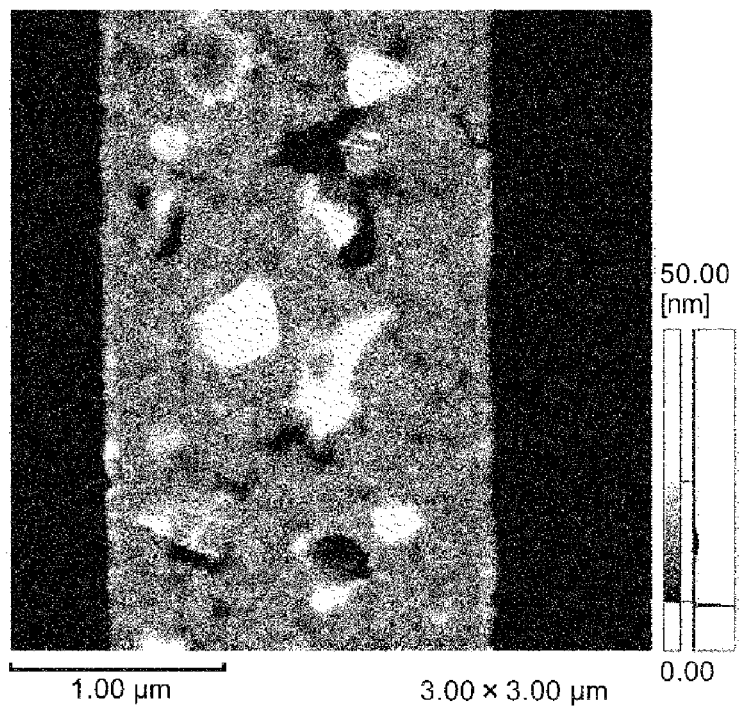
FIG. 16A is an enlarged view showing an atomic force microscope image of patterned graphene produced according to parameters B.
Figure 16B:
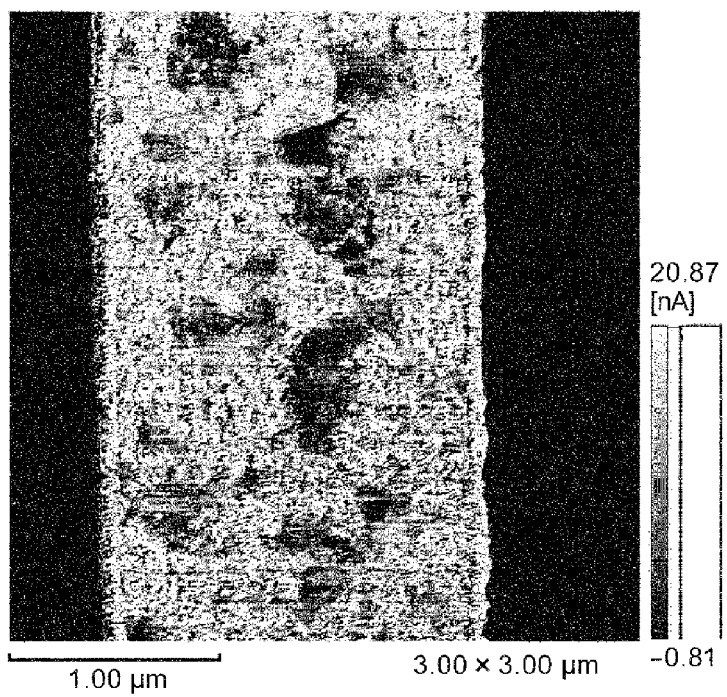
FIG. 16B is a diagram showing an electrical current map of patterned graphene produced according to parameters B.

On the other hand, in the case of parameters B, although the resistance is slightly high but the smoothness is good. Consequently, the structure and the electrical conductivity were further examined for the case of parameters B FIG. 16A is an enlarged view showing an atomic force microscope image of patterned graphene 102 produced according to the parameters B, and FIG. 16B is a diagram showing an electrical current map of the patterned graphene 102 produced according to the parameters B. The example will be described below referring to the figures.

From the figures it becomes clear that at a region with a flat line the electrical conductivity is superior, and at a raised region or a depressed region the electrical conductivity is low. Conceivably, this is because the graphene according to the present production method is formed vertical to the substrate surface by c-axis orientation, and if a probe is placed at a raised region, the current flows first through a path in a c-axis direction with high resistance then to a flat region.

Example 11

In the Example 3, graphene is grown in a direction linearly, and thereafter the same is grown in the direction orthogonal to the line, namely in the direction for broadening the width of the line to form planar graphene.

According to the present embodiment, a graphene device having planar graphene is formed by a simpler technique.

Figure 17:
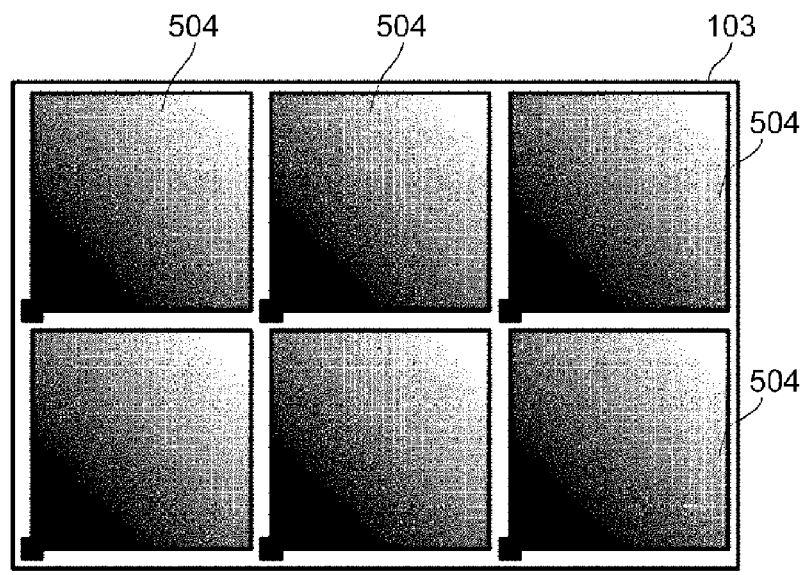
FIG. 17 is a diagram illustrating a process of a production direction for a graphene device according to the present embodiment.

FIG. 17 is a diagram illustrating a process of a production direction for a graphene device according to the present embodiment. The example will be described below referring to the figure.

In the figure a step is illustrated, in which the metallic layer 504 is formed on the carbon layer 502 (hidden in the figure) with uniform thickness already formed on the substrate 103.

The metallic layer 504 is depicted in the figure with shading, and a region with darker shading indicates that the metallic layer 504 is thinner there, and a region with lighter shading indicates that the metallic layer 504 is thicker there.

The metallic layer 504 according to the present embodiment is formed to a grid. Each grid square has a shape, of which a tiny square constituting the first region is connected with the left lower apex of a large square constituting the second region.

The thickness of the metallic layer 504 is thinner in the first region than in the second region, and there is a gradient in the second region increasing from the left lower apex toward 3 other apexes.

With such a constitution, the heating is conducted as the above embodiments to dissolve the carbon layer 502 in the metallic layer 504. As the result, the carbon concentration at a zone with dark shading in the figure becomes high, and the carbon concentration at a zone with light shading becomes low.

Consequently, when a metal is removed under conducting the heating, graphene precipitates first in the first region, namely near the left lower apex of the grid square. The graphene precipitated there is in general polycrystalline.

If the heating and the removal of a metal are continued, polycrystalline grains are confined to any one as a crystal nucleus by a constriction (bottleneck) near the left lower apex of the grid square. Consequently, the width of the constriction is made sufficiently smaller than a typical magnitude of the particle diameter of a polycrystalline grain to be precipitated by such a construction method. In this way, graphene precipitated at a part of the second region touching the constriction becomes a single crystal.

According to this invention, carbon grows from the single crystal as a nucleus toward 3 other apexes in the second region, namely spreads in the upper right direction.

In this case, since the crystal nucleus of growing carbon is confined by a constriction, any of grid patterned planar graphene obtained in the end becomes a single crystal.

While, the shapes of the first region and the second region are not necessarily limited to square, but are able to take any shape. For example, if the second region takes a shape that is able to fill a plane, such as rectangle and regular hexagon, a large number of large planar graphene with the same shape is able to be formed simultaneously. Meanwhile, it is possible that the first region take any shape, insofar as a constriction is formed, and for example it is possible to adopt a round shape besides square.

Example 12

This Example attempts no active control on the growing direction of graphene, and corresponds to a simplified technique of the above Examples. Experiment results of a mode, in which the thickness of the carbon layer 502 and the thickness of the metallic layer 504 are formed constant respectively, and a mode, in which a mixture layer containing carbon and a metal mixed homogeneously is formed as an initial layer and formation of a metallic layer 504 is omitted, will be described below.

EXPERIMENT 4

In this Experiment formation of graphene 102 was compared under various conditions by exchanging the order of formation of a carbon layer 502 as an initial layer and a metallic layer 504. In this connection, the thickness of the metallic layer 504 was made constant in this Experiment.

Figure 18:
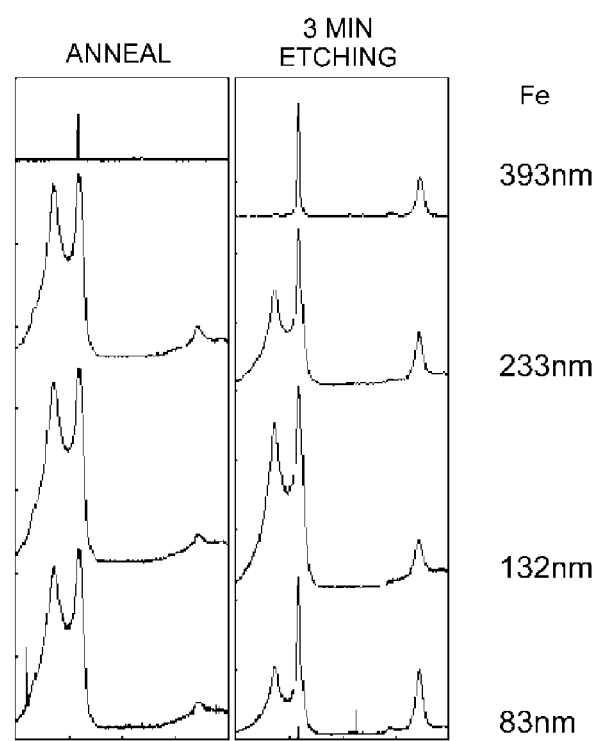
FIG. 18 is graphs showing features of Raman spectra in the event a carbon layer is formed on a metallic layer and cooled after annealing, and after etching for 3 min.

In this Experiment, Raman spectrum was examined for each case of:
(a) The thickness of the carbon layer 502: 113 nm;
(b) The thickness of the metallic layer 504 composed of iron: 83 nm, 132 nm, 233 nm, and 393 nm; and
(c) With annealing only, and with etching for 3 min FIG. 18 is graphs showing features of Raman spectra in the event a carbon layer 502 is formed on a metallic layer 504 and cooled after annealing, and after etching for 3 min The example will be described below referring to the figure. The abscissa of the respective graphs shown in the figure represents, similarly as in FIGS. 13A, 13B and 14, Raman shift from 1000 $cm^{-1}$ to 3000 $cm^{-1}$, and the ordinate represents intensity of the spectra.

As shown in the figure, if the metallic layer 504 is as thick as 393 nm, immediately after the annealing only a peak originated from noise is visible, and graphene 102 is not formed, but it is clear that by conducting the etching for 3 min graphene 102 with high crystallinity is able to be formed.

However, under other conditions, immediately after the annealing a peak indicating low crystallinity (the left-end peak of 3 peaks) appears. With the progress of etching the crystallinity is improved.

Compared to FIG. 14, by various conditions, such as the order of formation of the carbon layer 502 and the metallic layer 504, the thickness to be formed, and etching time, the crystallinity of the obtained graphene varies.

Consequently, by selecting experimentally the best combination considering the time required for production or the source material cost, graphene with high crystallinity is able to be obtained.

In this Experiment, the carbon concentration in the solid solution layer 505 is substantially constant and therefore active control on the growing direction of the graphene is not performed.

Therefore, if the growing direction of the graphene is controlled by means of, for example, providing a gradient in the thickness of the metallic layer 504 as disclosed in the above Examples, the crystallinity is able to be further improved.

EXPERIMENT 5

In this Experiment a mixture layer of carbon and iron was formed by co-depositing carbon and iron and forming a film simultaneously, and used as an initial layer. Then, without forming a metallic layer 504 heating was conducted to form a solid solution layer 505, and the metal was removed by etching. The parameters for the Experiment were as follows.

A mixture layer of iron and carbon was deposited on a silicon oxide/silicon substrate by sputtering to the thickness of 25 nm to 35 nm.

Thereafter heating was conducted in a quartz glass tube at 500° C., 600° C. and 700° C., then keeping the temperature a mixture gas of chlorine and argon (chlorine as a corrosive agent: 0.01 to 0.05 vol-%) was circulated under reduced pressure for etching.

Figure 19:
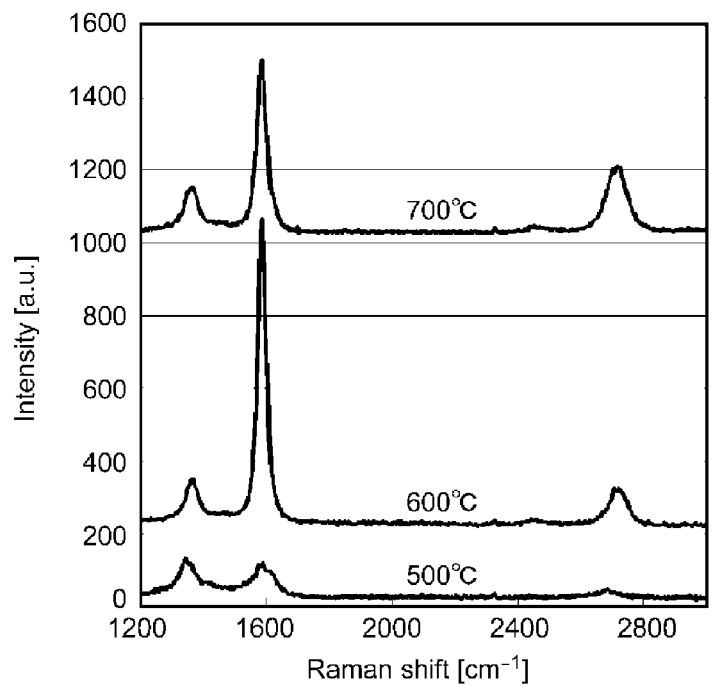
FIG. 19 is graphs showing features of Raman spectra corresponding to heating temperatures.

FIG. 19 is graphs showing features of Raman spectra corresponding to heating temperatures. The example will be described below referring to the figure.

As shown in the figure there are 3 peaks in each graph. Comparing the peaks, at 600° C. the central peak originated from a graphite structure is high and the right peak indicating generation of graphene also appears, however, the left peak indicating a defect is low. Therefore, the heating temperature was set at 600° C.

Further from an electron micrograph it became clear that particulate iron oxide was formed on the surface of the graphene 102.

Therefore, in forming the solid solution layer 505 by heating the mixture layer at 600° C., a mixture gas of hydrogen and argon (hydrogen: 25 vol-%) was circulated at 100 Torr for reducing iron oxide, followed by etching.

Figure 20:
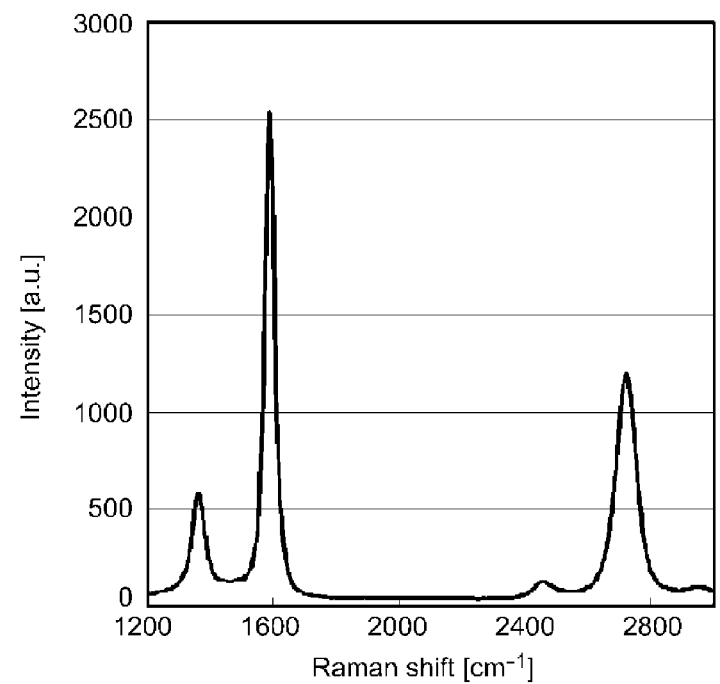
FIG. 20 is a graph showing features of a Raman spectrum of a sample prepared by a mode performing reduction of a metal oxide in forming a solid solution layer.

FIG. 20 is a graph showing features of a Raman spectrum of a sample prepared by a mode performing reduction of a metal oxide in forming a solid solution layer. The example will be described below referring to the figure.

As shown in the figure, according to the parameters the right peak indicating formation of graphene is larger, which indicates that graphene with high crystallinity is formed.

Although in this Experiment, the carbon concentration in the solid solution layer 505 was substantially constant and therefore active control on the growing direction of the graphene was not performed, high crystallinity was resulted.

Therefore, if the growing direction of the graphene is controlled by means of, for example, forming the metallic layer 504 provided with a gradient in the thickness as disclosed in the above Examples, the crystallinity is able to be further improved.

In this regard, in any of the above Examples, it is possible to refrain from intentional control on the growing direction of graphene, by omitting the formation of the metallic layer 504.

With respect to a treatment process, in which the solid solution layer 505 is formed by heating a co-deposited film (thickness 35 nm) of iron and carbon, and the film is then etched by chlorine, influence of the change in a hydrogen partial pressure during the heating is described below. The hydrogen functions therein as a reducing agent.

Figure 21:
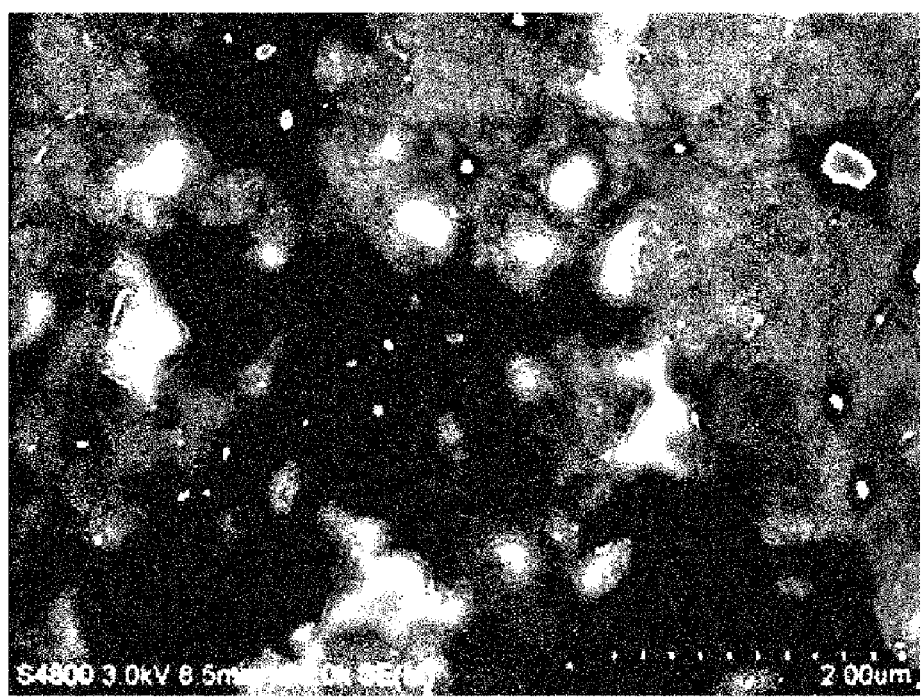
FIG. 21 is a scanning electron microscope picture showing final features of a graphene crystal when the hydrogen partial pressure is 1 Torr.
Figure 22:
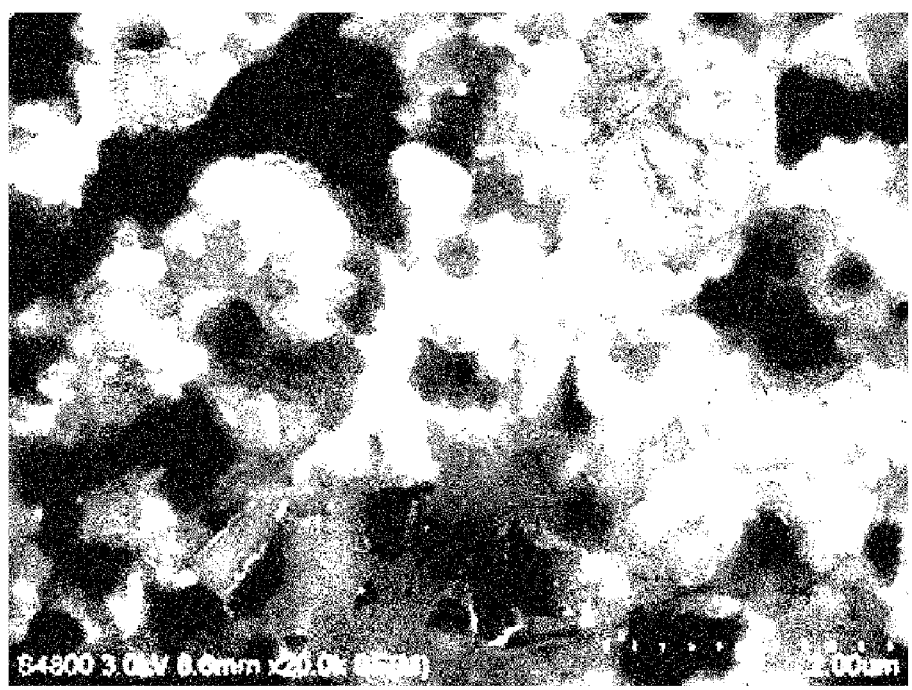
FIG. 22 is a scanning electron microscope picture showing final features of a graphene crystal when the hydrogen partial pressure is 20 Torr.

FIG. 21 is a scanning electron microscope picture showing final features of a graphene crystal when the hydrogen partial pressure is 1 Torr. FIG. 22 is a scanning electron microscope picture showing final features of a graphene crystal when the hydrogen partial pressure is 20 Torr. The example will be described below referring to the figures.

In FIG. 21,
(a) at a right upper position, a large region surrounded by black and white duplex rims;
(b) at a right middle position, a white bright point surrounded by a black rim; and
(c) at a right slightly lower position, a white bright point surrounded by a black rim;
and additionally small white bright points are imaged. They are particles of iron oxide.

In FIG. 22 such a bright point is not recognized at all, which indicates that the crystal shape of graphene is better than in the Example shown in FIG. 21.

The figures show that reduction with the heating in forming the solid solution layer 505 is effective.

Since the carbon concentration in the solid solution layer 505 is increased substantially uniformly due to etching of a metal, graphene nucleates at a random position. Since etching is performed keeping the heating, carbon holds high mobility and is able to diffuse over long distance. Therefore, by such a mode, carbon is incorporated by the firstly nucleated graphene, new nucleation of graphene is suppressed, and graphene 102 with relatively large crystal grain size is able to be obtained. Further, in any of the above Examples a silicon substrate with thermally oxidized film is able to be adopted as the substrate 103, and graphene 102 is able to be formed directly without remaining a metal on the substrate 103.

This application claims priority based on Japanese Patent Application No. 2011-042781 filed on 28 Feb. 2011, the entire disclosure of which is incorporated by reference herein as far as the national law of the designated State permits.

INDUSTRIAL APPLICABILITY

According to the present invention, a production method for graphene, graphene produced on a substrate, and graphene on a substrate are able to be provided.

REFERENCE SIGNS LIST

101 Graphene device
102 Graphene
103 Substrate
104 Crystal grain boundary
401 Source electrode
402 Drain electrode
403 Insulator
404 Gate electrode
501 First mask
502 Carbon layer
503 Second mask
504 Metallic layer
505 Solid solution layer
601 Line-shaped graphene
602 Planar graphene
801 Third mask
901 Self-supporting mask
902 Slit

The invention claimed is:

1. A production method for graphene comprising:
   a forming step for forming a solid solution layer on a substrate, the solid solution layer comprising a metal in a solid state dissolving carbon, by heating to a solid solution temperature; and
   a removing step for growing the graphene made out of carbon precipitating from the solid solution layer, by supplying an etching gas to remove the metal from the solid solution layer while maintaining the solid solution temperature.

2. The production method according to claim 1, wherein a concentration distribution in a direction parallel to a surface of the substrate among concentration distributions of the carbon in the solid solution layer is made inhomogeneous, so as to grow the graphene in the direction parallel to the surface of the substrate.

3. A production method for graphene, wherein a line-shaped graphene grown in a first direction parallel to a surface of a substrate and directly attached to the surface is produced by the production method according to claim 2, and
   a planar graphene grown from the line-shaped graphene in a second direction parallel to the surface and directly attached to the surface is produced by the production method according to claim 2.

4. The production method according to claim 1, wherein in the forming step, a reducing agent that is able to reduce an oxide of the metal is supplied.

5. The production method according to claim 4, wherein in the forming step:

a metallic layer comprising the metal is formed on the substrate, an initial layer comprising carbon is formed on the formed metallic layer, and the formed initial layer and the formed metallic layer are heated to the solid solution temperature to form the solid solution layer.

6. The production method according to claim 4, wherein in the forming step:

an initial layer comprising a mixture of the metal and carbon is formed on the substrate, and the formed initial layer is heated to the solid solution temperature to form the solid solution layer.

7. The production method according to claim 4, wherein a concentration distribution of the supplied etching gas in a direction parallel to a surface of the substrate is made inhomogeneous, so as to grow the graphene in the direction parallel to the surface of the substrate.

8. The production method according to claim 4, wherein the substrate is a silicon dioxide substrate or a silicon substrate provided with a silicon dioxide layer on a surface, the metal is iron, nickel, cobalt, or an alloy comprising the same, and the etching gas is chlorine.

9. The production method according to claim 4, wherein in the forming step:

an initial layer comprising carbon is formed on the substrate, a metallic layer comprising the metal is formed on the formed initial layer, and the formed initial layer and the formed metallic layer are heated to the solid solution temperature to form the solid solution layer.

10. The production method according to claim 9, wherein in the forming step the initial layer is formed into a predetermined pattern, so as to form the graphene in the predetermined pattern.

11. The production method according to claim 9, wherein in the forming step the initial layer is formed to cover all or a part of a surface of the substrate, so as to form the graphene into a uniform continuous film covering all or a part of the surface of the substrate.

12. The production method according to claim 9, wherein the thickness of at least one of the formed initial layer and the formed metallic layer is made inhomogeneous, so as to make a concentration distribution in a direction parallel to a surface of the substrate among concentration distributions of the carbon in the solid solution layer inhomogeneous, and to grow the graphene in the direction parallel to the surface of the substrate.

13. The production method according to claim 12, wherein the thickness of the formed metallic layer is provided with a gradient, so as to grow the graphene in the direction of a component parallel to the surface of the substrate among directions of the gradient.

14. The production method according to claim 13, wherein the metallic layer comprises a first region extending parallel over a surface of the substrate and a second region extending parallel over a surface of the substrate, the two regions being connected by a constriction, the first region having smaller thickness of the metallic layer than the second region, and the second region being provided with a gradient in the thickness of the metallic layer, which increases with the distance from the constriction.

* * * * *